United States Patent
Alva et al.

(10) Patent No.: US 11,432,421 B2
(45) Date of Patent: Aug. 30, 2022

(54) COUPLING SYSTEMS AND METHODS FOR ELECTRONIC DEVICES

(71) Applicant: Intel Corporation, Santa Clara, CA (US)

(72) Inventors: Samarth Alva, Bangalore (IN); Krishnakumar Varadarajan, Bangalore (IN); Yogesh Channaiah, Chikkegowda Badavane (IN); Prakash Pillai, Bangalore (IN); Sagar Pawar, Bangalore (IN); Aneesh Tuljapurkar, Bangalore (IN); Raghavendra N, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 16/847,106

(22) Filed: Apr. 13, 2020

(65) Prior Publication Data
US 2020/0245483 A1    Jul. 30, 2020

Related U.S. Application Data

(63) Continuation of application No. 15/864,583, filed on Jan. 8, 2018, now Pat. No. 10,653,026.

(51) Int. Cl.
*G06F 1/16* (2006.01)
*H05K 5/00* (2006.01)
(Continued)

(52) U.S. Cl.
CPC ......... *H05K 5/0256* (2013.01); *G06F 1/1615* (2013.01); *G06F 1/1656* (2013.01);
(Continued)

(58) Field of Classification Search
CPC .... G06F 1/1624; G06F 1/1633; G06F 1/1662; G06F 1/1667; G06F 1/1669;
(Continued)

(56) References Cited

U.S. PATENT DOCUMENTS 6,366,440 B1 * 4/2002 Kung ...................... E05C 19/16
                                                          361/147
6,697,251 B1 * 2/2004 Aisenberg ............. G06F 1/1616
                                                          248/118.1
(Continued)

OTHER PUBLICATIONS

U.S. Appl. No. 15/864,583, filed Jan. 8, 2018, Coupling Systems and Methods for Electronic Devices.
(Continued)

*Primary Examiner* — Anthony M Haughton
(74) *Attorney, Agent, or Firm* — Schwegman Lundberg & Woessner, P.A.

(57) ABSTRACT

Illustrative examples include a system for coupling a first electronic device to a second electronic device. The first electronic device may include a housing having a first engagement surface and a first magnet array. The first engagement surface may be adapted to receive the second electronic device. The second electronic device may include a second magnet array. An actuator coupled to the first magnet array may move the first magnet array relative to the housing and the second magnetic array, to attractively couple or repulsively de-couple the second electronic device from the first electronic device.

20 Claims, 24 Drawing Sheets

(51) Int. Cl.
  *H05K 7/00* (2006.01)
  *H05K 5/02* (2006.01)
  *G06K 7/10* (2006.01)
  *H01F 7/02* (2006.01)

(52) U.S. Cl.
  CPC ........... *G06K 7/10158* (2013.01); *H01F 7/02* (2013.01); *H01F 7/0252* (2013.01)

(58) Field of Classification Search
  CPC ...... G06F 1/1671; G06F 1/1684; G06F 1/169; G06F 1/1692; H01F 7/02; H01F 7/0252
  See application file for complete search history.

(56) References Cited

U.S. PATENT DOCUMENTS

| | | | | |
|---|---|---|---|---|
| 6,929,291 | B2* | 8/2005 | Chen | E05C 19/16 |
| | | | | 292/251.5 |
| 8,310,823 | B2* | 11/2012 | Stoltz | G06F 1/1696 |
| | | | | 361/679.17 |
| 8,582,797 | B2* | 11/2013 | Wang | H04R 5/04 |
| | | | | 381/386 |
| 9,746,885 | B2* | 8/2017 | Delpier | G06F 1/1681 |
| 9,921,610 | B2* | 3/2018 | Lu | G06F 1/166 |
| 10,078,351 | B1* | 9/2018 | Chang | G06F 1/182 |
| 10,139,862 | B1* | 11/2018 | Nakamura | G06F 1/1694 |
| 10,768,662 | B2* | 9/2020 | Tsai | G06F 1/1669 |
| 2010/0283270 | A1* | 11/2010 | Hood, III | E05B 17/0033 |
| | | | | 292/251.5 |
| 2011/0031766 | A1* | 2/2011 | Huang | E05B 17/0033 |
| | | | | 292/251.5 |
| 2016/0284497 | A1* | 9/2016 | Stryker | G06F 1/1643 |
| 2017/0017273 | A1* | 1/2017 | Weldon | G06F 1/1681 |
| 2019/0215975 | A1 | 7/2019 | Alva et al. | |
| 2020/0166964 | A1* | 5/2020 | Tsai | G06F 1/1624 |

OTHER PUBLICATIONS

"U.S. Appl. No. 15/864,583, Restriction Requirement dated Oct. 5, 2018", 8 pgs.

"U.S. Appl. No. 15/864,583, Response filed Dec. 5, 2018 to Restriction Requirement dated Oct. 5, 2018", 8 pgs.

"U.S. Appl. No. 15/864,583, Non Final Office Action dated Mar. 21, 2019", 9 pgs.

"U.S. Appl. No. 15/864,583, Response filed Jun. 21, 2019 to Non-Final Office Action dated Mar. 21, 2019", 11 pgs.

"U.S. Appl. No. 15/864,583, Final Office Action dated Oct. 7, 2019", 9 pgs.

"U.S. Appl. No. 15/864,583, Response filed Dec. 9, 2019 to Final Office Action dated Oct. 7, 2019", 12 pgs.

"U.S. Appl. No. 15/864,583, Notice of Allowance dated Jan. 6, 2020", 8 pgs.

* cited by examiner

COUPLING SYSTEMS AND METHODS FOR ELECTRONIC DEVICES

PRIORITY APPLICATION

This application is a continuation of U.S. application Ser. No. 15/864,583, filed Jan. 8, 2018, which is incorporated herein by reference in its entirety.

TECHNICAL FIELD

This document pertains generally, but not by way of limitation, to systems for coupling a first electronic device and a second electronic device. More particularly, this disclosure may be applied to an example modular computer system. In an example system, the first electronic device may be a user interface module and the second electronic device may be a compute module. In some examples, the user interface module may be a foldable electronic device, such as a laptop.

BACKGROUND

Electronic devices, including laptops, desktops, gaining consoles and mobile devices have built in hardware processing circuitry that is integral to the device.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various examples discussed in the present document.

DETAILED DESCRIPTION

Example systems and methods for coupling electronic devices are described herein.

One example electronic device that may incorporate the coupling systems described herein may include a laptop computer. Generally, laptops are smaller and lighter than a desktop computer having a separate monitor and keyboard. Therefore, a laptop computer is commonly used to provide lightweight, portable computing.

Traditionally, laptops include one or more housing portions connected to one another in a clam shell arrangement. Laptops may also include user interfaces, such as a display, keyboard, and cursor control. Generally, the processing power of a laptop may be provided by processing circuitry (e.g., electrical circuitry, hardware) that is disposed inside, integral, and protected by a housing of the laptop.

One benefit of the example systems described herein is to create a modular electronic device having a removable compute module. This allows the user to use the same processing circuitry in more than one electronic device, such as a laptop and a gaming console or desktop. The modular systems described herein also allow a user to modularly customize other aspects of an electronic device as well.

In an example, the processing circuitry may be provided as a modular compute module that may be operably coupled to a user interface module (e.g., a laptop or other user interface). The systems herein allow a user to interface with the same compute module in multiple ways. Using the modular compute module, users may have the lightweight, portable benefits of a laptop, or the added flexibility to use the same modular compute module in a desktop computer or gaming console having a different user interface such as a larger display or different user input interfaces.

The examples described herein generally show and describe a first electronic device in the form of a user interface module and second electronic device in the form of a compute module. The compute module may be operably coupled to the user interface module to form a modular laptop computer. However, the concepts may also be applied to other electronic devices. Such devices may include: foldable electronic devices, 2-in-1 convertible computers, tri-fold type computers, gaming consoles, mobile devices including cell phones and tablets, and desktop computers. Other components may be modularly coupled, such as, but not limited to, batteries and input/output devices such as keyboards, cursor controls, and other controls or displays.

Figure 1:
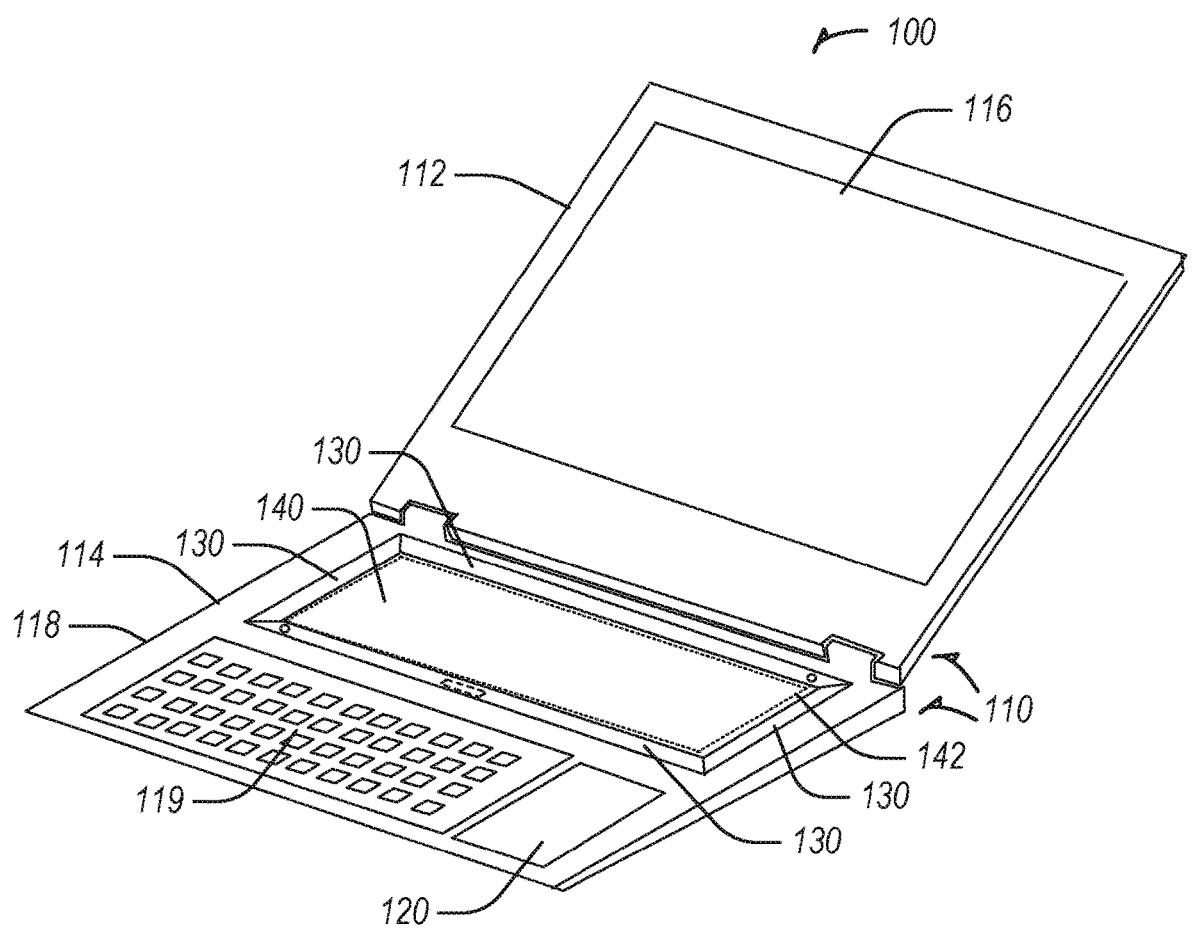
FIG. 1 is a perspective view of a first electronic device, in accordance with at least one example.

FIG. 1 shows a perspective view of a first electronic device 100 (herein after first device), in accordance with at least one example. In an example, the first device 100 may be a clamshell device having a housing 110 including a first portion 112 hingeably coupled to a second portion 114. In some examples, the first portion 112 and the second portion 114 may be slidably, pivotably, or foldably coupled to each other.

As shown in the example of FIG. 1, the first portion 112 may include a display portion 116 and the second portion 114 may be a base portion 118. The base portion 118 may be a user input module and may include a keyboard 119, a cursor control 120 and a first engagement surface 130. FIG. 1 merely represents one example of a first device 100, the features described herein may be used with any other suitable electronic devices.

The first device 100 may be configured to receive and operably couple to a second electronic device 200 (hereinafter second device). An example second device 200 is shown and described in FIG. 2. The second device 200 may be coupled to the first engagement surface 130 of the first device.

In some examples, the first engagement surface 130 may be a solid or mostly solid surface configured to accept insertion of the second device 200 therein. In some examples, the first engagement surface 130 may be solid. The embodiment as shown in FIG. 1, includes an aperture 140 extending through the second portion 114 of the housing 110 to reduce the thickness of the first device, rather than having a solid base portion 118.

Figure 2:
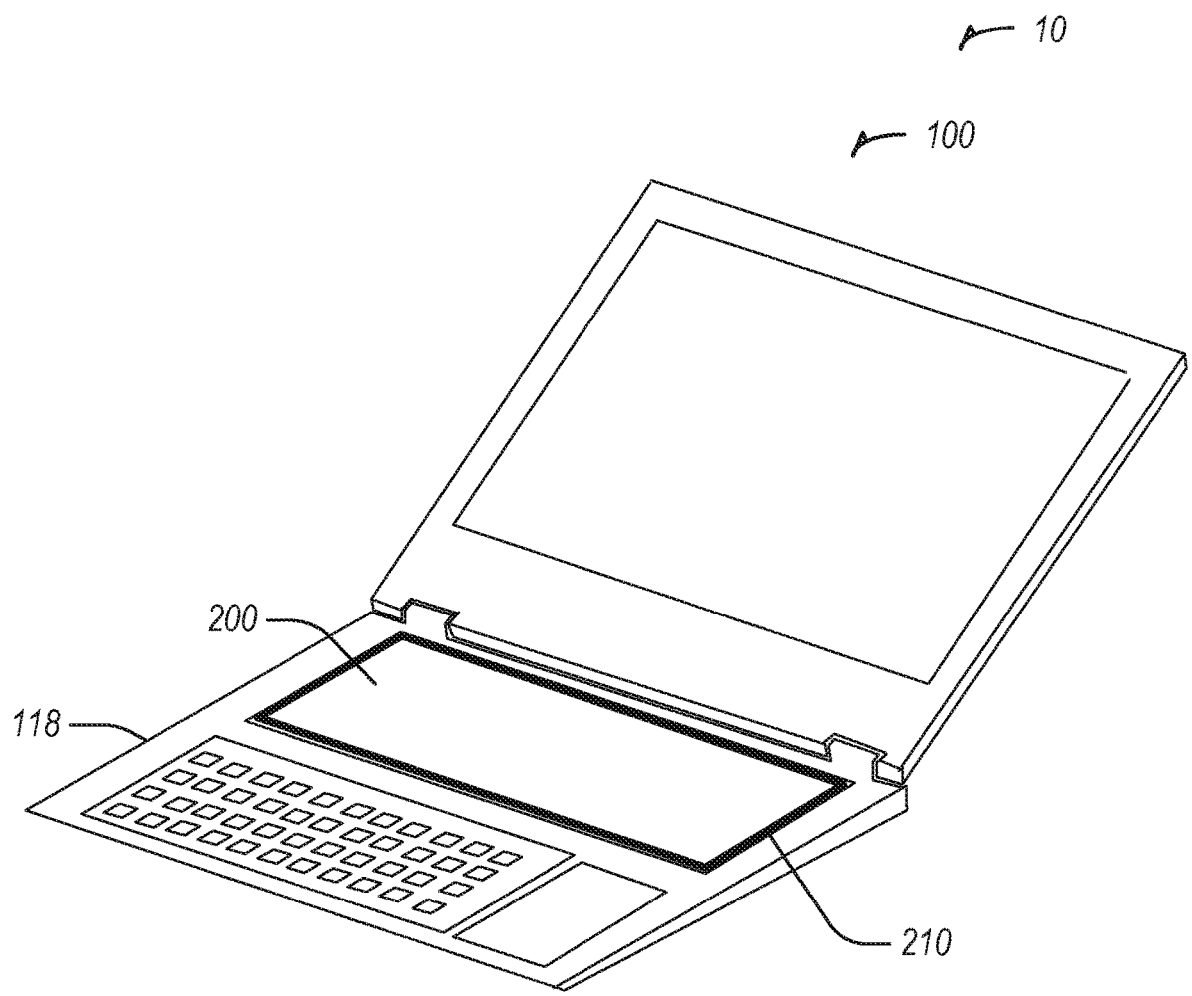
FIG. 2 is a perspective view of a second electronic device coupled to the first electronic device of FIG. 1, in accordance with at least one example.

The aperture 140 may be surrounded by an aperture perimeter 142. The aperture perimeter 142 may be smaller than a perimeter 210 of the second electronic device 200 to be received (FIG. 2). A benefit of having the aperture perimeter 142 be smaller than the perimeter 210 of the second device 200 is that it allows the first device 100 to support the second device 200, and prevent the second device 200 from falling through the aperture 140.

FIG. 2 shows a perspective view of a modular laptop 10 including the first device 100 of FIG. 1 and the second device 200 received at the first engagement surface 130. When the second device 200 is received by the first device 100, the second device 200 may be supported by the first engagement surface 130. In the example of FIG. 1, where the first engagement surface 130 includes the aperture 140, the second device 200 may be supported by the first engagement surface 130 proximate the aperture perimeter 142. When the second device 200 is supported by the first engagement surface 130, as shown in FIG. 2, the second device 200 may partially or completely cover the aperture 140.

Figure 3:
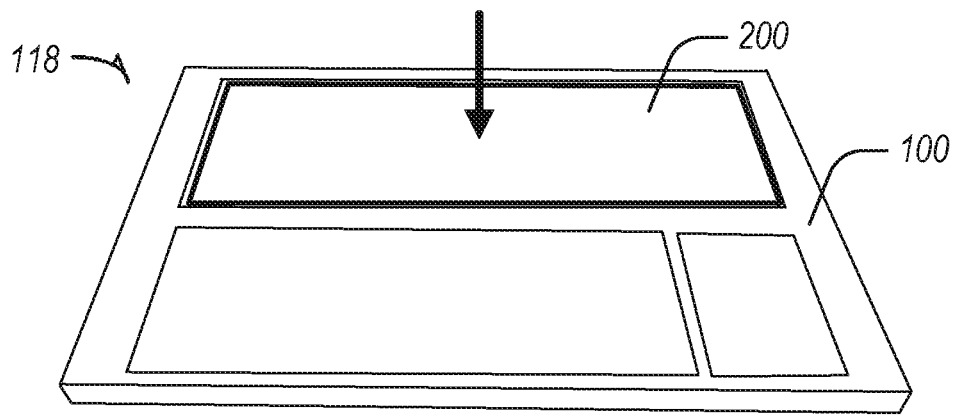
FIG. 3 is a top perspective view of a base portion of the first electronic device and the second electronic device of FIG. 2 in a coupled state, in accordance with at least one example.
Figure 4:
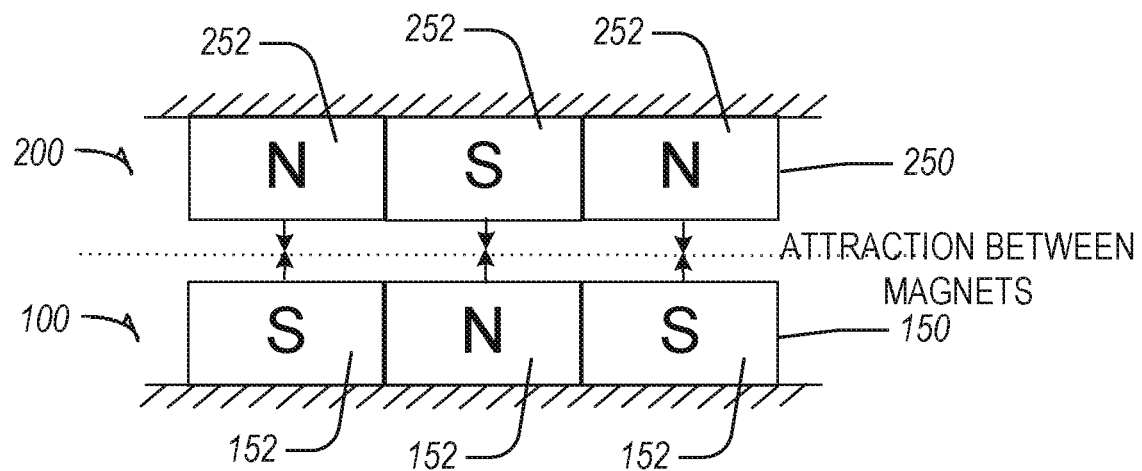
FIG. 4 is a schematic of a first magnet array of the first electronic device and a second magnet array of the second electronic device, in the coupled state shown in FIG. 3, in accordance with at least one example.
Figure 5:
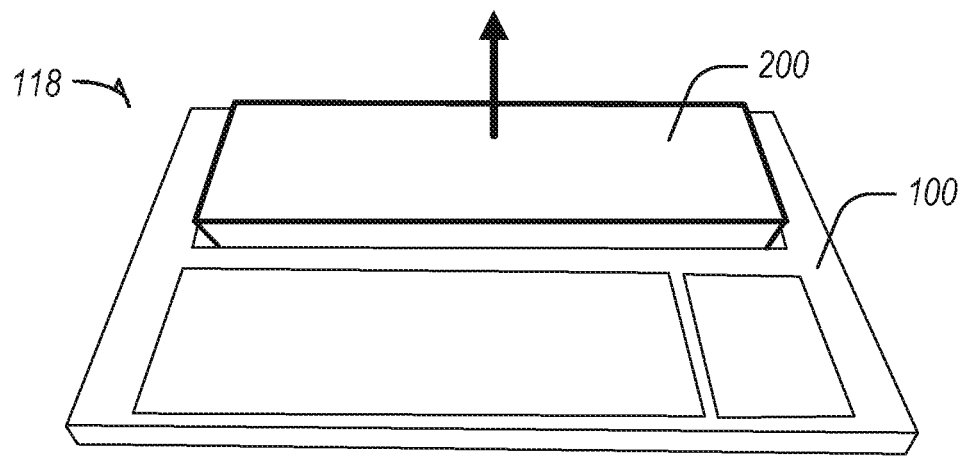
FIG. 5 is a top perspective view of the base portion of the first electronic device of and the second electronic device of FIG. 2, in a de-coupled state, in accordance with at least one example.
Figure 6:
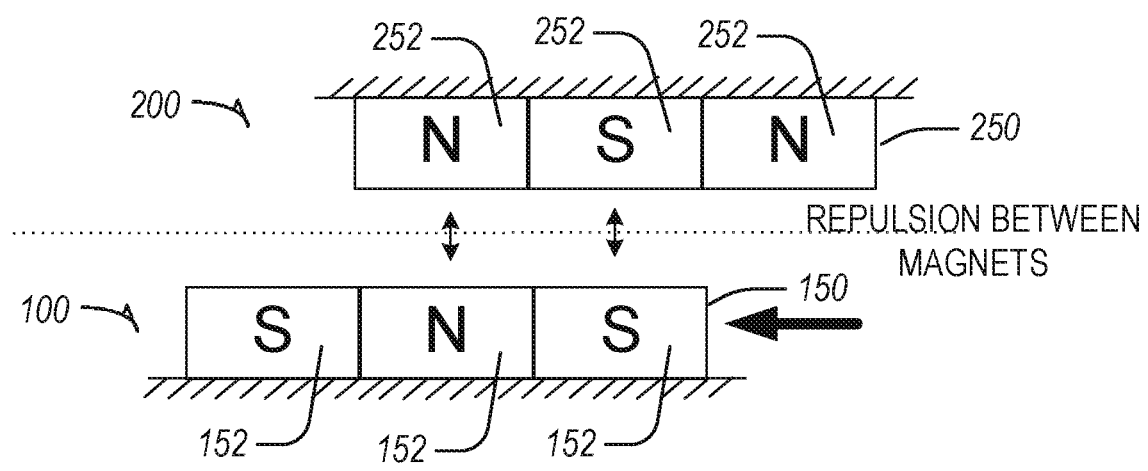
FIG. 6 is a schematic of the first magnet array of the first electronic device and the second magnet array of the second electronic device, in the de-coupled state shown in FIG. 5, in accordance with at least one example.

FIGS. 3-6 depict aspects of a magnetic coupling system for coupling and de-coupling the second device 200 to and from the first device 100. The magnetic coupling system facilitates coupling and decoupling by inducing magnetic attractive or repulsive forces between the first and second devices 100, 200. The magnetic forces may be provided by a first magnet array 150 coupled to the first device 100, and a second magnet array 250 coupled to the second device 200 (FIGS. 4 and 6).

To allow the magnetic coupling system to switch between attractive and repulsive forces, at least one of the first magnet array 150 and the second magnet array 250 may be movable. In the examples described herein, the first magnet array 150 may be movable within the first device 100, and the second magnet array 250 may be fixed within the second device 200. In other examples, this arrangement may be reversed, or both the first and second magnet arrays 150, 250 may be movable within their respective first or second device 100, 200.

In an example, FIG. 3 shows a top perspective view of the base portion 118 of the first device 100 and the second device 200, in a coupled state. In support of FIG. 3, FIG. 4 is a schematic that shows how the attractive force to couple the first and second devices 100, 200 may be generated.

FIG. 5 shows a top perspective view of the base portion 118 of the first device 100 and the second device 200, in a de-coupled state. In support of FIG. 5, FIG. 6 is a schematic that shows how the repulsive force may be generated by shifting the first magnet array 150 relative to the second magnet array.

As shown in FIG. 4, to couple the first device 100 and the second device 200, an attractive magnetic force may be created between the first magnet array 150 and the second magnet array 250 to pull the second device 200 towards the first device 100. In some examples, the attractive force may be created by moving the first magnet array 150 to a first position (e.g., coupled position) where opposite poles on the first magnet array 150 and the second magnet array are aligned (e.g., generally aligned, face each other, more aligned than misaligned, more attractive than repulsive). In some examples, aligned like poles may be generally aligned to the extent that the first and second magnet arrays 150, 250 generate a magnetic force that provides some, but not the maximum attractive force possible at other positions.

In the coupled state, the first magnet array 150 and second magnet array 250 may not actually touch one another. For example, the first and second magnet array 150, 250 may be internal to their respective first and second devices 100, 200 but close enough to generate magnetic forces.

As shown in FIG. 6, to de-couple the first device 100 and the second device 200, a repulsive magnetic force may be created between the first magnet array 150 and the second magnet array 250 to push the second device 200 away from the first device 100. The repulsive force may be created by moving the first magnet array 150 to a second position (e.g., de-coupled position) where like poles on the first magnet array 150 and the second magnet array 250 are aligned (e.g., generally aligned, face each other, more aligned than mis-aligned, more repulsive than attractive). In some examples, mis-aligned like poles may generate a neutral magnetic force that provides no significant repulsive or attractive force but still provides de-coupling.

Each of the first and second magnet arrays 150, 250 may include one or more magnets arranged in various patterns. As shown in the example of FIGS. 4 and 6, the first and second magnet arrays 150, 250 may include a plurality of magnets 152, 252 arranged serially with alternating poles. For example, the first magnet array 150 may include a S-N-S arrangement, and the second magnet array 250 may include a N-S-N arrangement.

The first magnet array 150 may be moved by input from the user or automatically based on input from a sensor, to a coupled or de-coupled position. In the coupled position, the attractive force between the first and second magnet arrays 150, 250 may operably couple the first device 100 to the second device 200 producing a physical connection limiting relative movement between the first and second devices 100, 200.

The coupling may also include an electrical connection, such as a transmission of data and/or power between the first and second devices 100, 200. The attractive force may be sufficient to compress an electrical connection such as a set of pogo pins, electrical fingers, or other electrical connection joining the first and second devices 100, 200.

Figure 9:
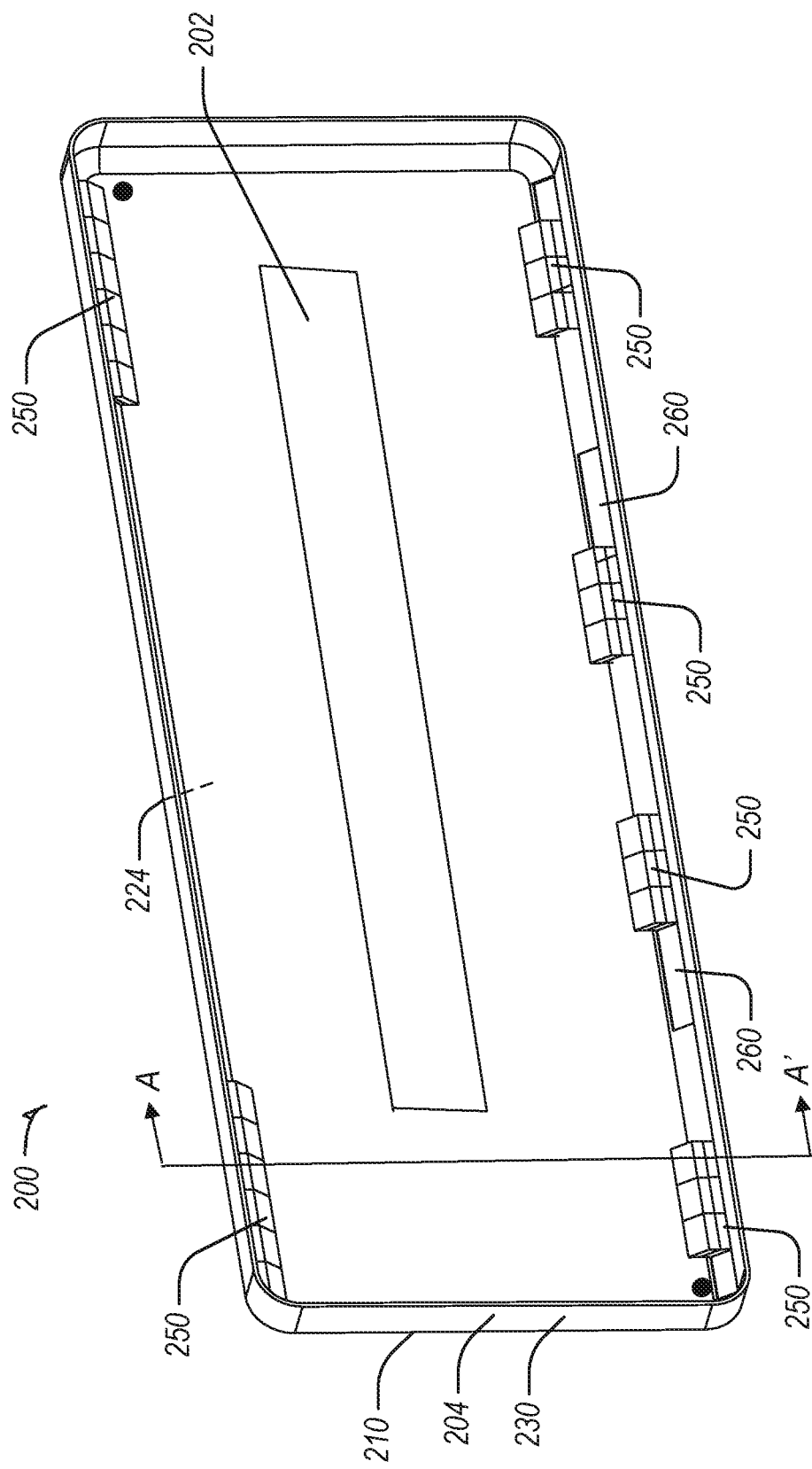
FIG. 9 is a top perspective view of an internal portion of the second electronic device, in accordance with at least one example.

For example, the first device 100 (FIG. 7) may include a first electrical connector 160 to operably couple to a second electrical connector 260 on the second device 200 (FIG. 9). The first and second electrical connectors 160, 260 may enable transmission of data and/or power between the first and second devices 100, 200. In some examples, the first device 100 may include a first processor 102 (e.g., one or more processors, processing circuitry, hardware).

In the de-coupled position, the repulsive force of the first and second magnet arrays 150, 250 may be sufficient to hover (e.g., float) the second device 200 over the first engagement surface 130, making removal by the user easier. In some examples, the strength of the first and second magnet arrays 150, 250 may cause the second device 200 to hover at least 1 mm above, and more preferably about 5 mm above the first engagement surface 130 in the de-coupled state. In some examples, the second device 200 may hover between 1 mm and 9 mm, or possibly more preferably between 3 mm and 7 mm above the first engagement surface 130 in the de-coupled state.

FIGS. 4 and 6 show two positions of the first and second magnet arrays 150, 250. However, any number of positions may be provided, including a neutral position that is neither a coupled position or a de-coupled position. In some examples, the neutral, de-couple or coupled position may be a default position.

Example first and second devices 100, 200 incorporating the magnetic coupling system of FIGS. 3-6 will be described in further detail with respect to FIGS. 7-14 and the method of FIGS. 15 and 16.

Figure 7:
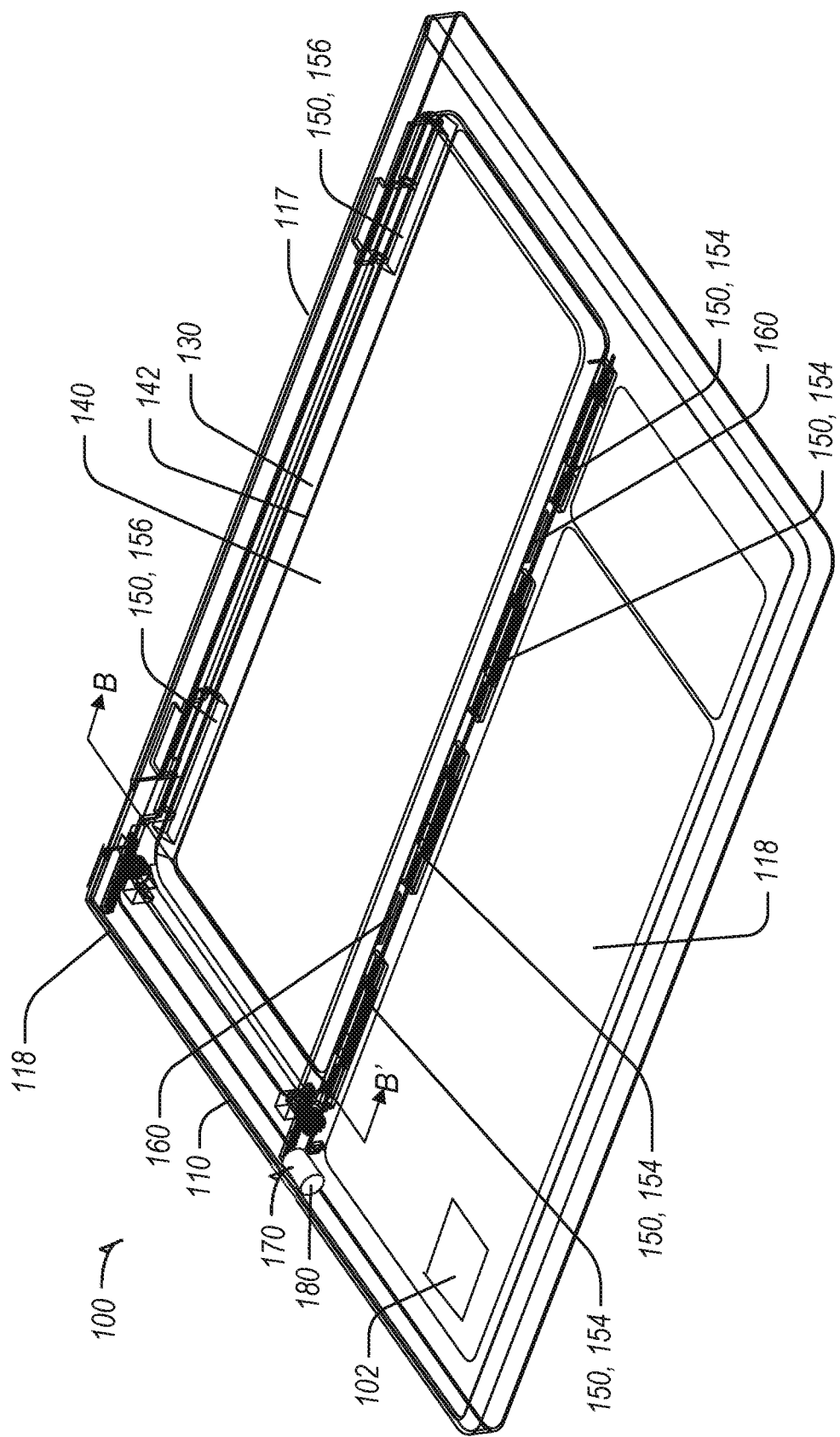
FIG. 7 is a top perspective view of a portion of the first electronic device including a motion transfer mechanism disposed inside a housing, in accordance with at least one example.
Figure 8:
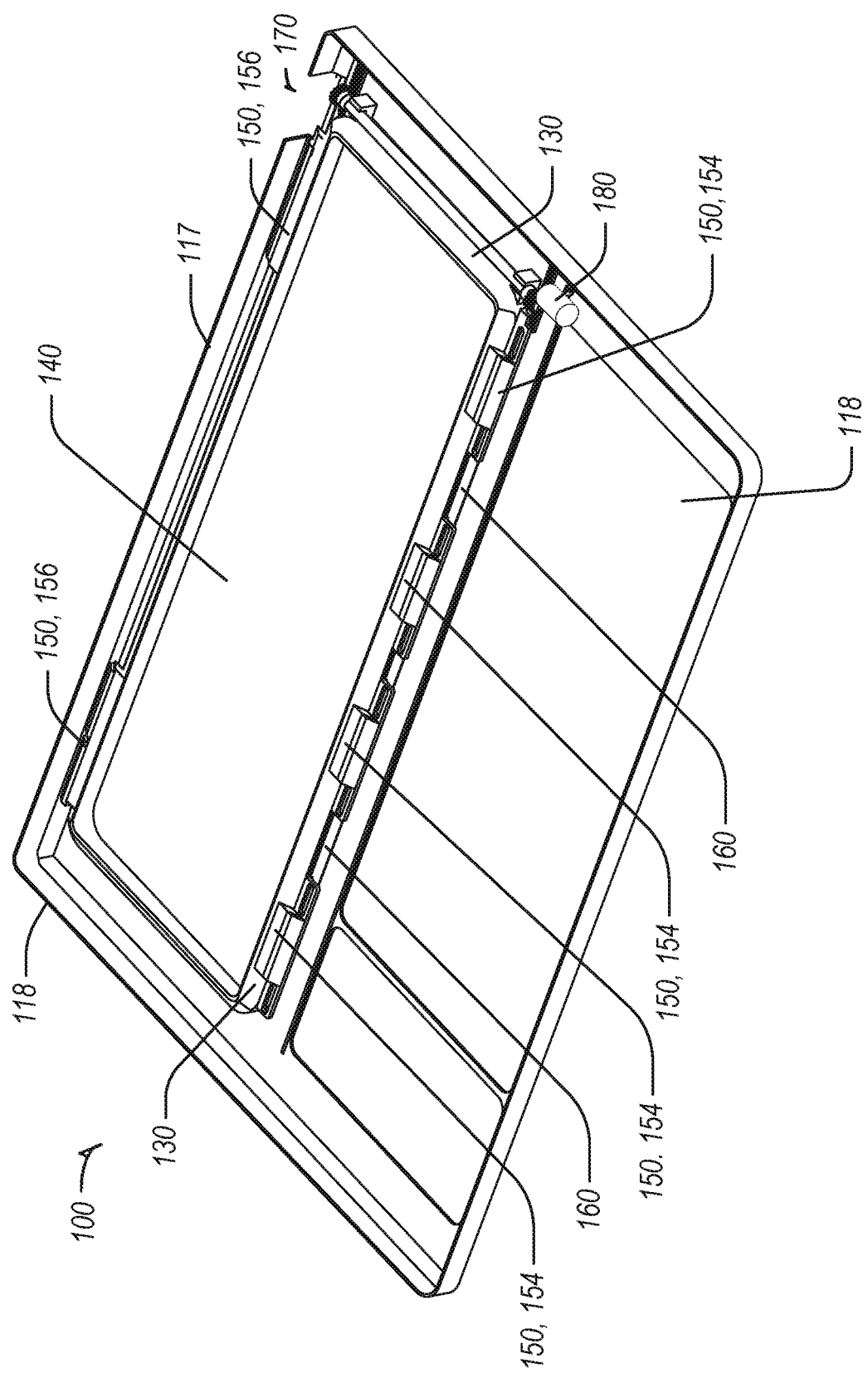
FIG. 8 is a bottom perspective view of a portion of the first electronic device and the motion transfer mechanism of FIG. 7, with a portion of the housing removed, in accordance with at least one example.

FIGS. 7 and 8 show top and bottom perspective views of portions of the base portion 118 of the first device 100.

As shown in FIGS. 7 and 8, the first magnet array 150 may be movably coupled to a motion transfer mechanism 170 disposed inside the housing 110. The example motion transfer mechanism 170 may provide movement to the first magnet array 150 to couple or de-couple the first and second devices 100, 200. The motion transfer mechanism 170 may be coupled to the housing 110 and to the first magnet array 150. This arrangement allows the first magnet array 150 to move relative to the housing 110 to perform at least one of operably coupling or decoupling to the second device 200 when received by the first electronic device 100.

In a non-limiting example, the first magnet array 150 may include one or more magnet arrays. The example of FIGS. 7 and 8 may include a first located first magnet array such as bottom first magnet array 154, and a second-located first magnet array such as top first magnet array 156. In the example, the bottom first magnet array 154 is located closer to the keyboard (closer to the user), and the top first magnet array 156 is located closer to the hinge portion 119 (further from the user). The terms bottom and top first magnet arrays 150, 154, 156 may be used as shown in the drawings or known in the art, however bottom and top may describe any two magnet arrays (e.g., any first located first magnet array, any second located first magnet array, etc.).

For example, the bottom and top magnet arrays 154, 156 may include magnet arrays located proximate opposite sides of the first engagement surface 130. Such as one array near one side of the first engagement surface 130 (e.g., one side of the perimeter 142), and another array near an opposite side of the first engagement surface 130 (e.g., another side of the perimeter 142). In another example, the bottom and top magnet arrays 154, 156 may be spaced apart from one another anywhere proximate the first engagement surface 130.

The first magnet arrays 150 may be moved relative to the housing 110, (and relative to the second electronic device when the second device 200 is placed at the first engagement surface 130). In some examples, the motion transfer mechanism 170 may include an actuator 180 to provide motion to the first magnet arrays 150.

An example arrangement of the first and second magnet arrays 150, 250 with respect to one another will be described in further detail related to the cross-sectional drawings of FIGS. 10 and 11. Details of the motion transfer mechanism 170 will be described in further detail with reference to FIGS. 12-14.

FIG. 9 shows a top perspective view of an internal portion of an example second electronic device 200 (hereinafter second device 200) that incorporates aspects of the magnetic coupling system of FIGS. 3-6. The second device 200 may include processing circuitry 202 (e.g., processor hardware) housed and protected by an enclosure 204. The enclosure 204 may include a first surface 222 (FIG. 10) opposite a second surface 224 (FIGS. 9 and 10), and sidewalls 230 around the perimeter 210 extending therebetween (FIG. 10). The second surface 224 may be a second engagement surface configured to be coupled to the first engagement surface 130 of the first device (FIG. 7).

The second magnet array 250 may include a plurality of second magnet arrays 250 positioned at different locations around the enclosure 204. In the example of FIG. 9, the second magnet arrays 250 may be located proximate the second surface 224 and the perimeter 210 of the enclosure 204. The arrangement of the second magnet arrays 250 in the enclosure 204 will be described in further detail with respect to FIGS. 10 and 11.

Figure 10:
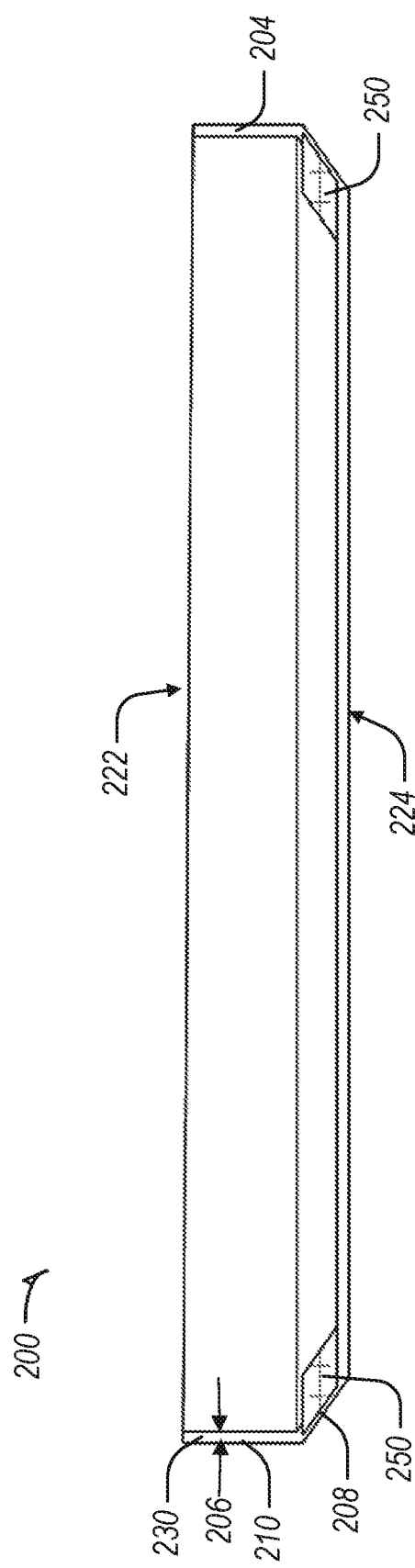
FIG. 10 is a cross-sectional view of the second electronic device of FIG. 9 taken along line A-A', in accordance with at least one example.
Figure 11:
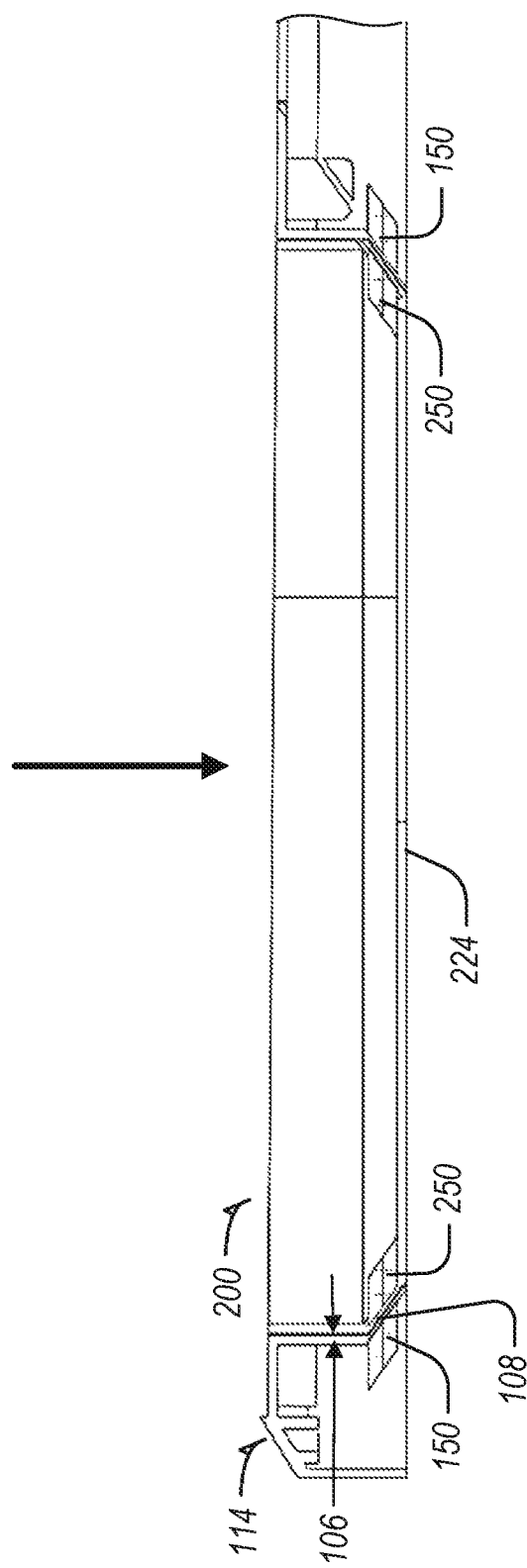
FIG. 11 is a cross-sectional view of the second electronic device of FIG. 9 taken along line A-A', coupled to the first electronic device of FIG. 7, taken in a cross-section along line B-B', in accordance with at least one example.

FIG. 10 shows a cross-sectional view of the second device 200 of FIG. 9 taken along line A-A'. In some examples, the second magnet arrays 250 may be housed inside the enclosure 204 having an enclosure thickness 206. The enclosure thickness 206 proximate the second magnet arrays 250 may be about 0.4 mm, or between 0.2 mm and 0.6 mm.

In some examples, the second magnet arrays 250 may be secured to the enclosure 204 along a bevel 208 proximate the perimeter 210 having sidewalls 230. A benefit of positioning the second magnet arrays 250 on the bevel is that it may provide a very compact arrangement with the first device 100, particularly when the first device 100 includes an aperture (140, FIG. 7).

This compact design is further shown and described with reference to FIG. 11. FIG. 11 shows a cross-sectional view of the second device 200 of FIG. 9, inserted and magnetically coupled to the first device of FIG. 7. The cross-section taken along line B-B'.

In some examples, the first magnet arrays 150 may be housed inside the housing 110 having a housing thickness 106. The housing thickness 106 proximate the first magnet arrays 150 may be about 0.4 mm, or between 0.2 mm and 0.6 mm.

In some examples, the first magnet arrays 150 may be secured to the housing 110 along a bevel 108 proximate the aperture perimeter 142. A benefit of positioning the first magnet arrays 150 on the bevel 108 as shown is that it may provide for a very compact package and good engagement for coupling with the second device 200. This is particularly useful, when the first device 100 includes an aperture 140 (FIG. 7). When an aperture 140 is provided in the first engagement surface 130, the bevel 108 provides a surface to prevent the second device 200 from falling through the aperture 140. In other examples, the first magnet array(s) 150 may also be located anywhere along a solid surface of the base portion 118, when no aperture 140 (FIG. 1) is provided.

Figure 12:
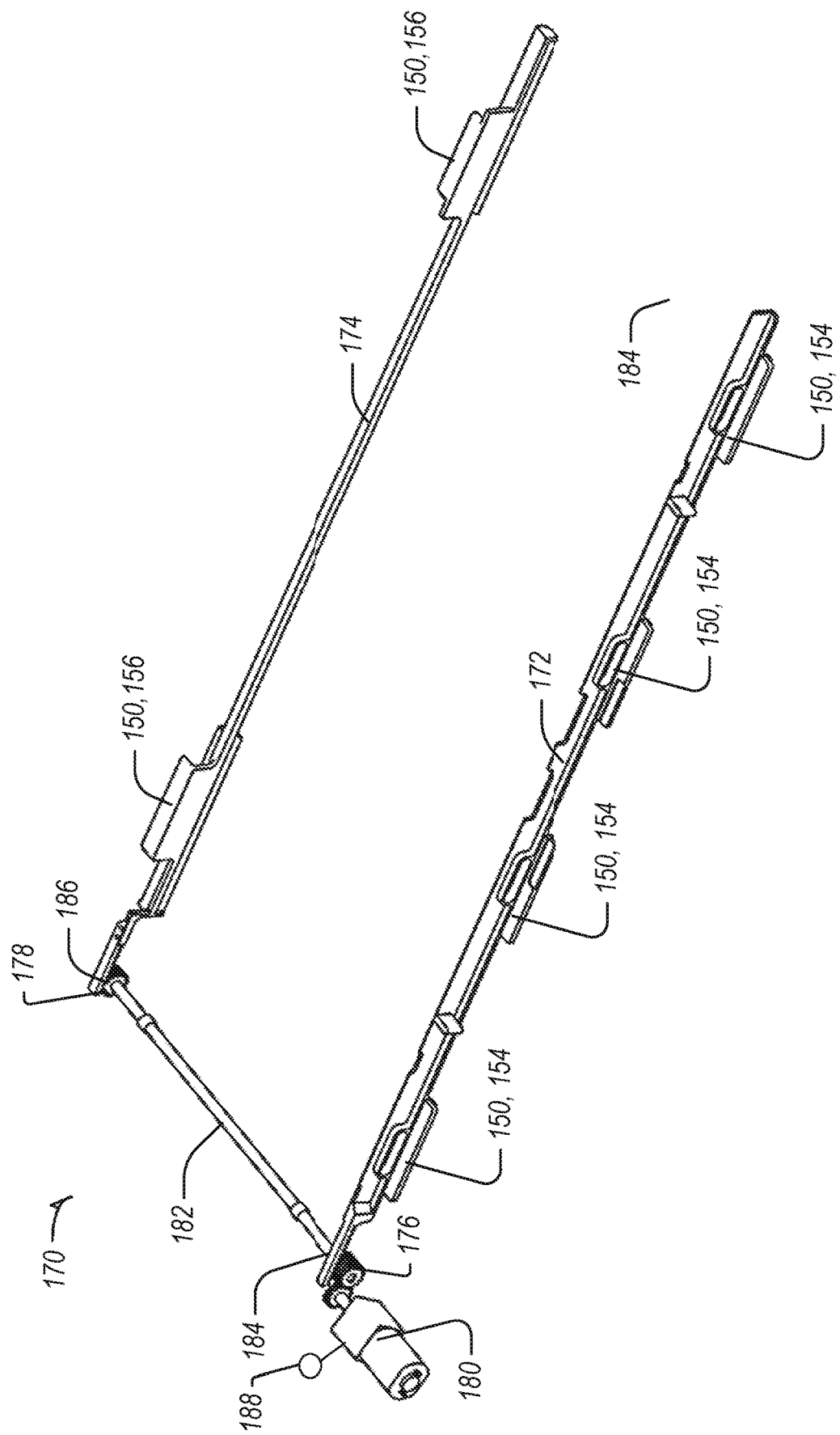
FIG. 12 is a top perspective view of the motion transfer mechanism of FIG. 7, in accordance with at least one example.
Figure 13:
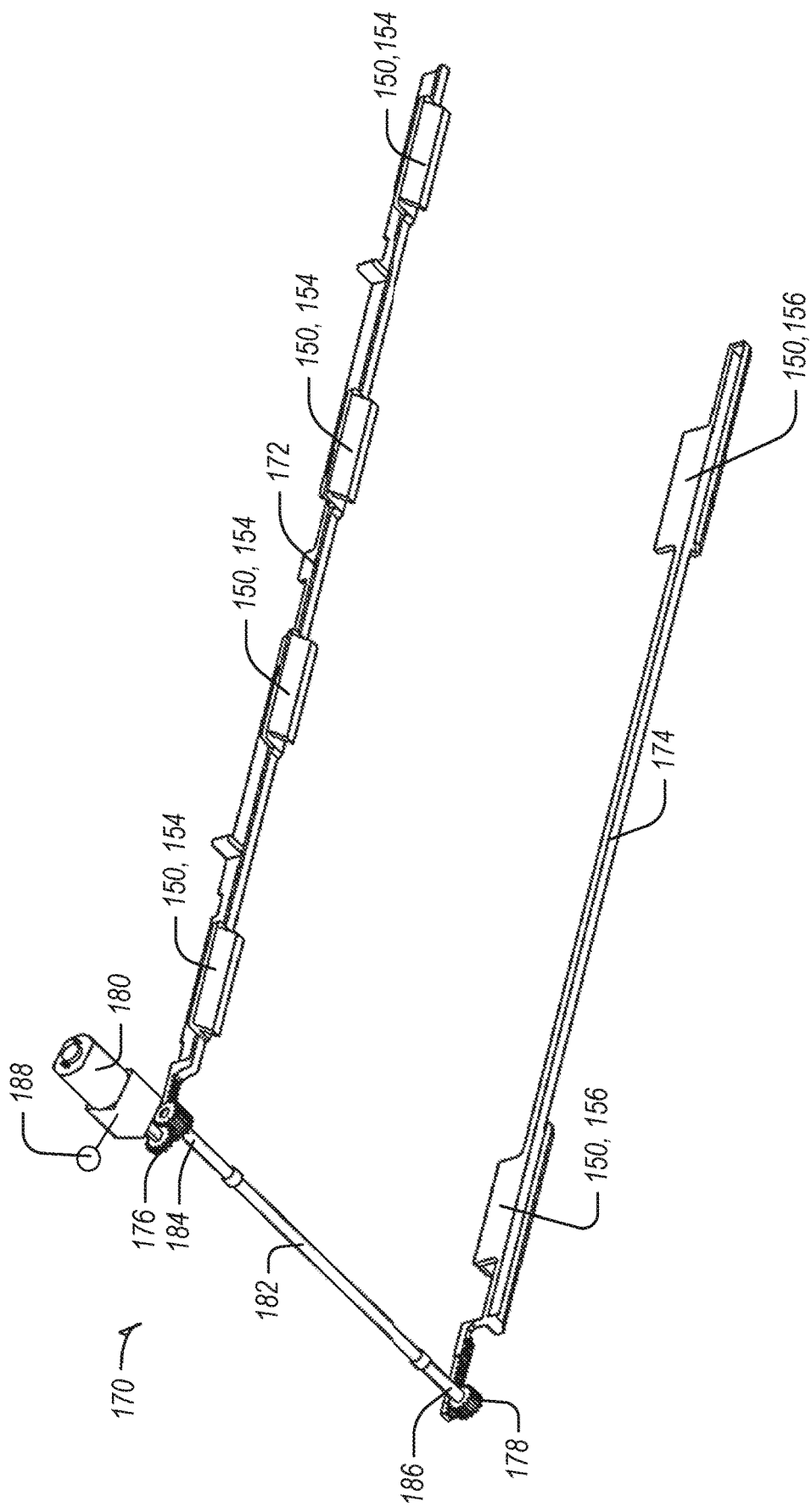
FIG. 13 is a bottom perspective view of the motion transfer mechanism of FIG. 7, in accordance with at least one example.

FIGS. 12 and 13 show top and bottom perspective views of the motion transfer mechanism 170 of FIGS. 7 and 8. To move the first magnet arrays 150, the first magnet arrays 150 may be mounted on one or more links, such as a first link 172 and a second link 174. The first and second links 172, 174 and first magnet arrays 150 may be moved by an actuator 180. The actuator 180 may be a mechanical or an electrical actuator such as a motor The motion transfer mechanism 170 may be adapted to transfer motion from the actuator 180 to a bottom magnet array 154 (e.g., first located first magnet array) and a top magnet array 156 (e.g., a second located first magnet array). As previously described with reference to FIGS. 7 and 8, the use of the terms top and bottom to describe the positioning of the first magnet arrays 150 are not limited to the locations shown.

When the second device 200 is received in the first device 100, and the motion transfer mechanism 170 moves the bottom and top magnet arrays 150, 154, 156 relative to the housing 110, the second magnet arrays 250 may be attracted to or repelled away from the first magnet arrays 150. This causes the first device 100 to pull the second device 200 towards the first engagement surface 130, or to push the second device 200 away from the first engagement surface 130.

In the example of FIGS. 12 and 13 a rack and pinion system (e.g., 176, 178) is shown to transfer rotational output from the actuator 180 into a linear output supplied to the first and second links 172, 174 to translate the bottom and top magnet arrays 150, 154, 156 relative to the housing (110, FIG. 7).

The rack and pinion system may include a connecting shaft 182 that extends from a first end portion 184 to a second end portion 186 to transfer motion from the actuator 180 to the first link 172 to move the bottom first magnet array 154, and to the second link 174 to move the top first magnet array 156.

The actuator 180 may be connected to the first end portion 184 of the connecting shaft 182 and a first link 172 by a first coupling mechanism 176, such as a first rack and pinion mechanism. The second end portion 186 of the connecting shaft 182 may be coupled to the second link 174 by a second coupling mechanism 178, such as a second rack and pinion mechanism. When the connecting shaft 182 is rotated, both the first and second links 172, 174 may be caused to translate. For example, the actuator 180, receiving an input instruction from an input element 188 such as a user-operated switch or a sensor, may rotate and thereby cause the first and second links 172, 174 carrying the bottom first magnet arrays 154 and the top first magnet arrays 156, to translate.

In some examples, both the top and bottom first magnet arrays 150, 154, 156 may be provided, or fewer magnet arrays may be provided, including a singular magnet array (e.g., one or more magnets).

The motion transfer mechanism 170 described herein is merely one example. Various other motion transfer mechanisms to move the one or more links may be provided including the use of cables, links and lead screws.

In some examples, instead of translating a magnet array, a magnet array may be rotated to change the polarity and generate both attractive and repulsive magnetic fields.

Figure 14:
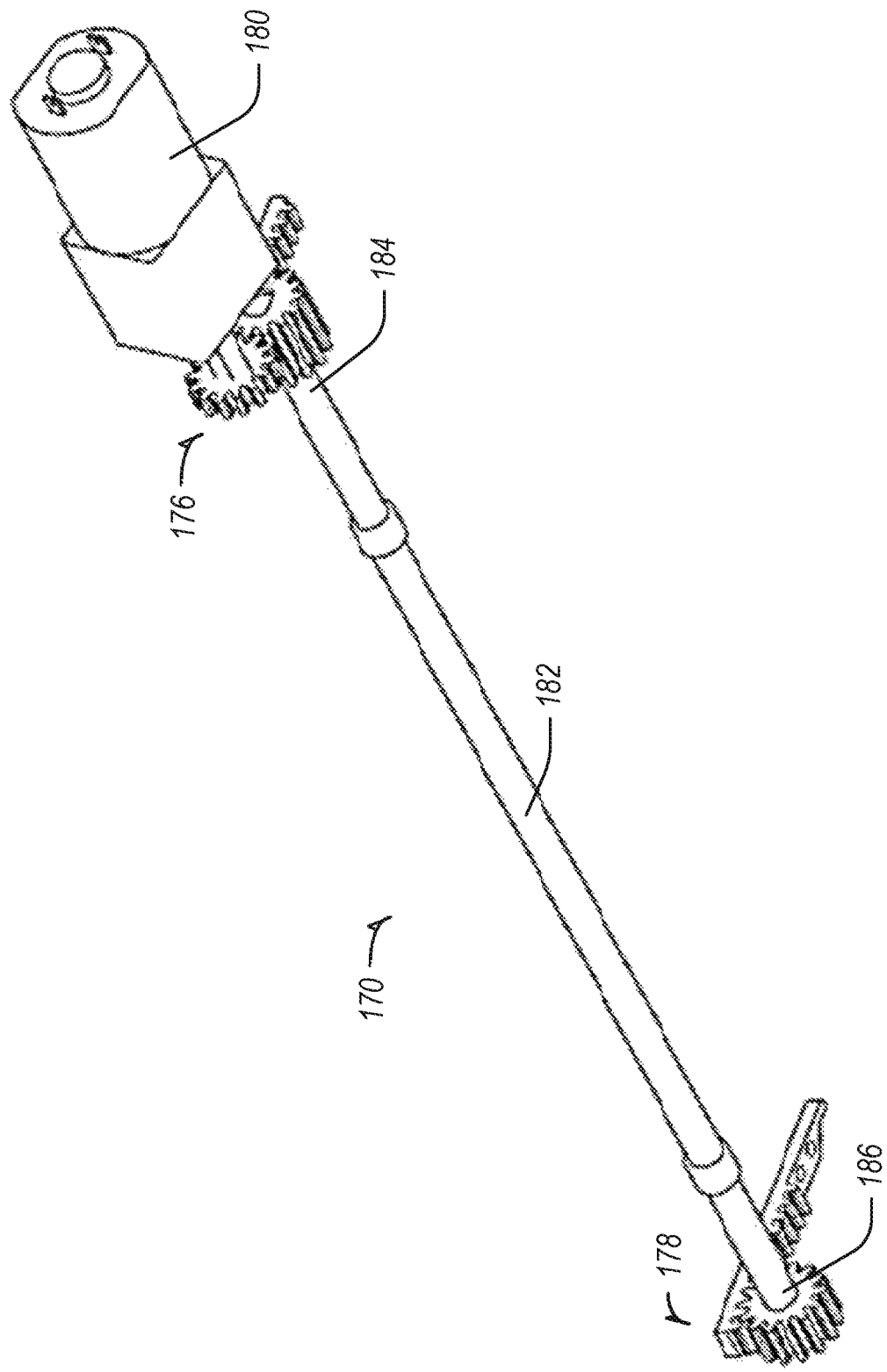
FIG. 14 is a close-up perspective view of a portion of the motion transfer mechanism of FIG. 13, in accordance with at least one example.

FIG. 14 shows a close-up bottom perspective view of a portion of the motion transfer mechanism 170 that is shown and described in FIG. 13. The close-up view includes the actuator 180, the first coupling mechanism 176, the connecting shaft 182 including the first end portion 184 and second end portion 186, and the second coupling mechanism 178.

Together, FIGS. 1-14 describe a first device for operably coupling or operably de-coupling the first device 100 and a second device 200 according to any of the examples previously set forth may include a means for receiving an indication to couple or decouple the second device 200 to or from the first engagement surface 130 (e.g., user operable input switch or a sensor 188, including an automatic sensor). The first device 100 may also include a means for sending an instruction, in response to the indication, to a means for transferring motion (e.g., a motion transfer mechanism 170), wherein the means for transferring motion may include a means for moving a first magnet array 150 of the first device 100 relative to a housing 110 of the first device 100 to perform at least one of operably coupling or operably decoupling the first device 100 and the second device 200.

The means for transferring motion 170 may include a means for rotating and a means for converting a rotating output from the means for rotating into a linear output delivered to a means for translating the first magnet array 150 relative to the housing 100. In some other examples, the means for transferring motion 170 may provide rotational motion to the first magnet array 150 instead of a linear motion. In some examples, the means for moving may include a means for moving a top magnet array and a means for moving a bottom magnet array.

Figure 15:
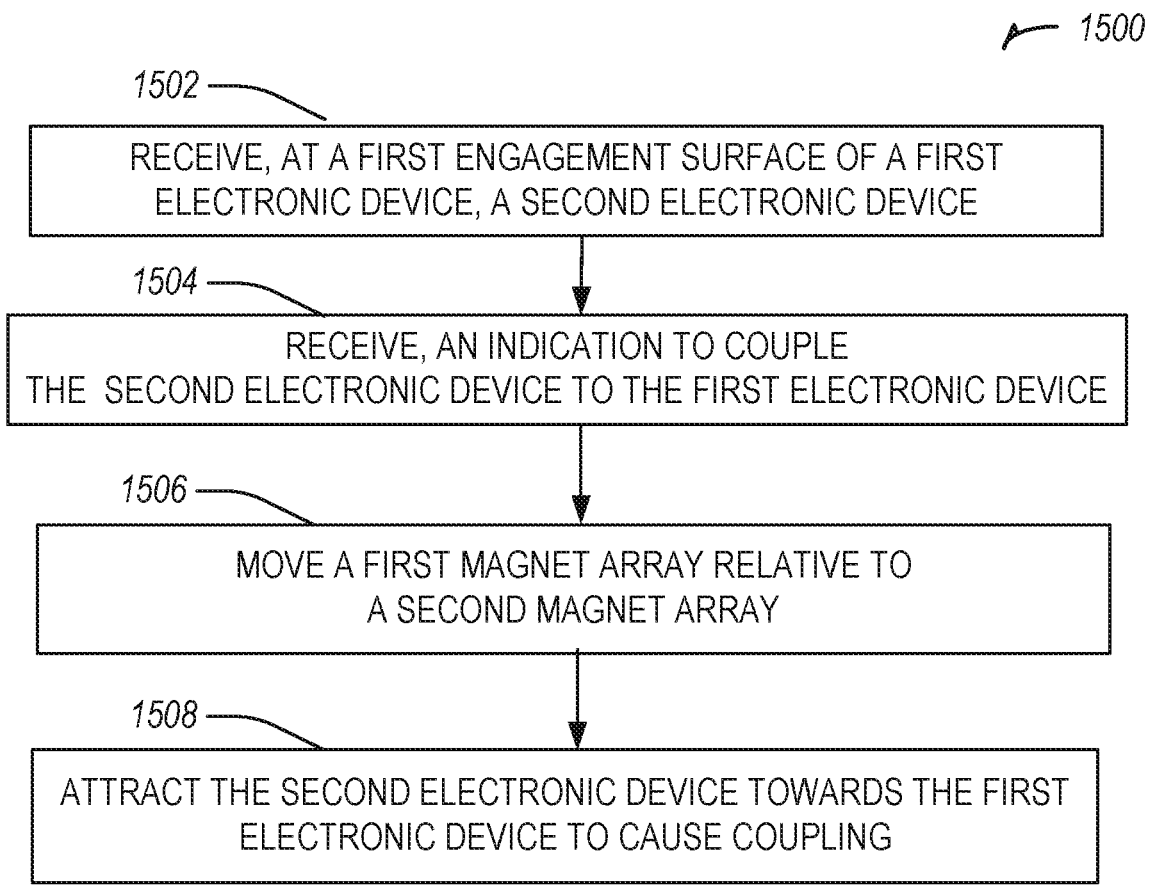
FIG. 15 is a flow chart illustrating a method of coupling a first electronic device and a second electronic device, in accordance with at least one example.

FIG. 15 shows a flow chart illustrating a technique for coupling a first electronic device (hereinafter first device) and a second electronic device (hereinafter second device), in accordance with at least one example. The method may be used with the first and second devices 100, 200 described in FIGS. 1-14, but may also be used with other devices.

Alternatively, the first and second devices 100, 200 described in FIGS. 1-14 may also be used with other methods.

Technique 1500 may include an operation 1502 to receive, at a first engagement surface of the first device, the second device. Operation 1504 may include to receive an indication to couple the second device to the first engagement surface (e.g., from a user operable input switch or a sensor).

Operation 1506 may include, based on receiving the coupling indication in operation 1504, to move a first magnet array in the first device relative to a second magnet array in the second device. In particular, operation 1506 may be performed by sending an instruction to the motion transfer mechanism, in response to the coupling indication, to move the first magnet array of the first device relative to the housing of the first device. Sending an instruction to the motion transfer mechanism may include sending an instruction to actuate a motor of the motion transfer mechanism.

Operation 1506 may include moving the first magnet array relative to the second magnet array. Moving may be accomplished by converting a rotational output from the motor into a linear output to translate the first magnet array relative to the housing. Converting the rotation output may be accomplished by transmitting the rotation output from the motor through a coupling mechanism such as rack and pinion system.

In some examples, operation 1506 may include moving a top magnet array and a bottom magnet array. This may be accomplished by rotating, with the motor, a connecting shaft extending from a first end portion to a second end portion, and translating a first link coupled to the first end portion to move the bottom magnet array and translating a second link coupled to the second end portion to move the top magnet array.

In some examples, in operation 1506, the first magnet array may be moved to a position that results in misalignment of the poles on the first magnet array and the second magnet array such that in operation 1508, an attraction magnetic force is generated between the first and second devices and, the first and second devices couple to each other. Operation 1508 may include the first and second devices becoming operably coupled to each other such that a physical and electrical connection may be established.

Figure 16:
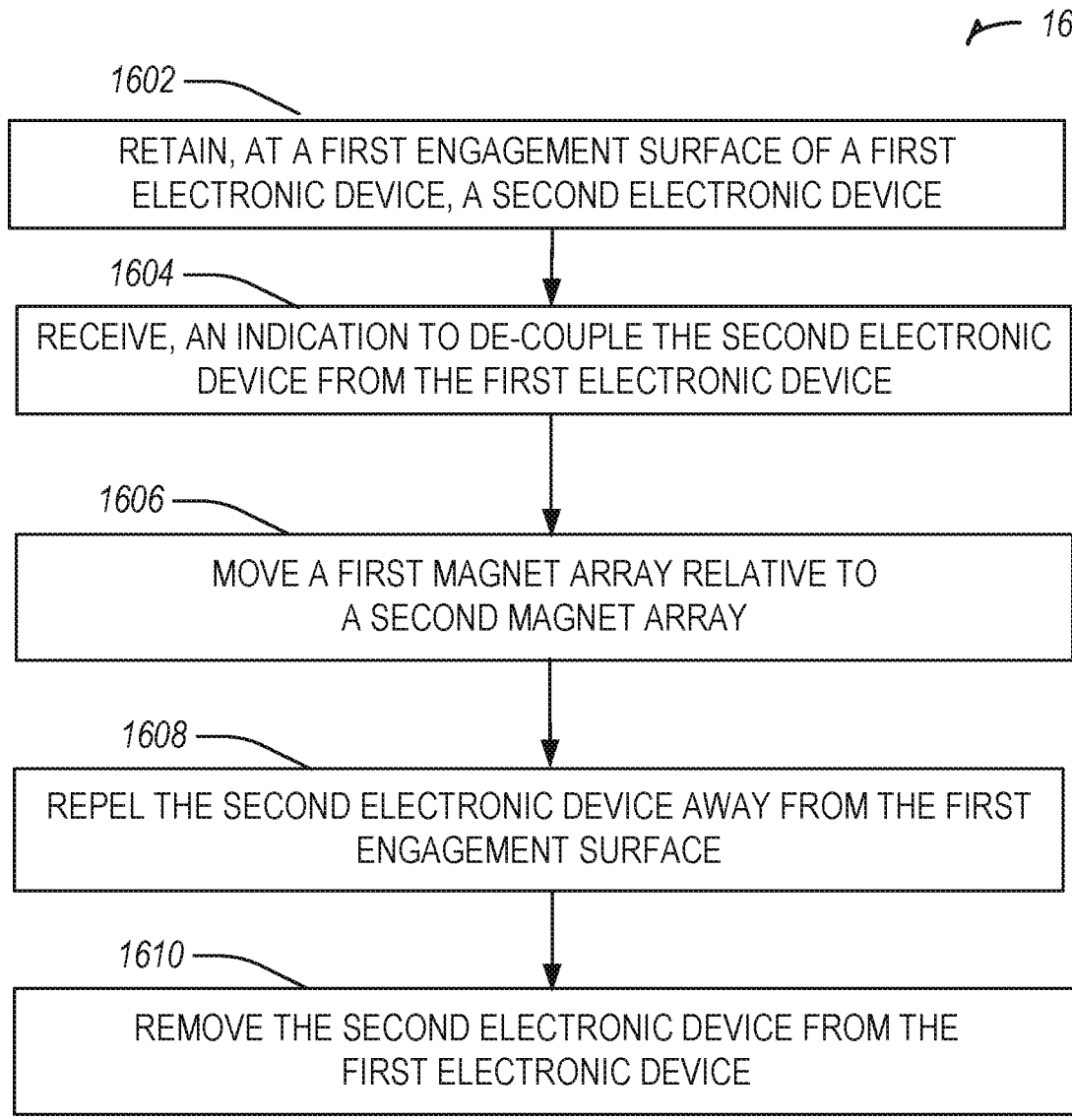
FIG. 16 is a flow chart illustrating a method of de-coupling a first electronic device and a second electronic device, in accordance with at least one example.

FIG. 16 shows a flow chart illustrating a technique for de-coupling a first electronic device (hereinafter first device) and a second electronic device (hereinafter second device) at a first engagement surface of the first device, in accordance with at least one example.

Technique 1600 may include an operation 1602 to retain, at the first engagement surface of a first device, the second device. Operation 1604 may include receiving, an indication to de-couple the second device from the first device. The indication may be a result of an electronic signal initiated by one of several ways. For instance, the electronic signal may be initiated by a user via a user interface (e.g., the user may activate an undock action using a cursor and clicking a user interface element). As another example, the electronic signal may be generated in response to a user activating a hard button on the base portion of the first device to undock the second device from the first device. As yet another example, the electronic signal may be automatically sent upon some event, such as a shutdown operation in an operating system, or as a result of a security option, such as when the user is detected to be logged out of the system.

Operation 1606 may include, based on receiving the de-coupling indication in operation 1604, to move a first magnet array in the first device relative to a second magnet array in the second device. In particular, operation 1606 may be performed by sending an instruction to a motion transfer mechanism, in response to the indication, to move the first magnet array of the first device relative to the housing of the first device. Operation 1606 may include moving the first magnet array relative to the second magnet array to a position that results in generating a repulsive magnetic force between the first and second devices. In some examples, the magnetic force may be generated by generally aligning like poles on the first magnet array and the second magnet array. With like poles aligned or generally aligned, in operation 1608 the second device may be caused to float above the first engagement surface of the first device. With the second device de-coupled and hovering over the first engagement surface by the induced magnetic field, operation 1610 may include the user removing the second device from the first device.

The techniques 1500 and 1600 may be performed by at least one machine-readable (e.g., computer readable) medium including instructions for operation of the first device. The first device may include a first processor (e.g., 102, FIG. 7, one or more processors, processing circuitry, hardware) for executing the instructions.

The instructions, when executed by a processor, may cause the processor to perform operations to receive an input instruction, from an input element. The input instruction may include an indication to couple or de-couple a second device to or from the first device. The input instruction may be received from a user operable switch on the first device or from a sensor.

In response to the received input instruction, the processor may send a movement instruction to an actuator to move a first magnet array of the first device relative to a housing of the first device to attract or repel a second device to couple or de-couple the first and second devices. In some examples, the input instructions may be received from the second device.

To send the movement instruction may include to send an instruction to move a first magnet array relative to the housing to attract or repel a second magnet array on a second device received by the first device. In some examples, the instruction may include an instruction to actuate a motor of a motion transfer mechanism.

Some example techniques or operations may be executed by a second processor (e.g., 202, FIG. 9, one or more processors, processing circuitry, hardware) of a second device 200.

Figure 17:
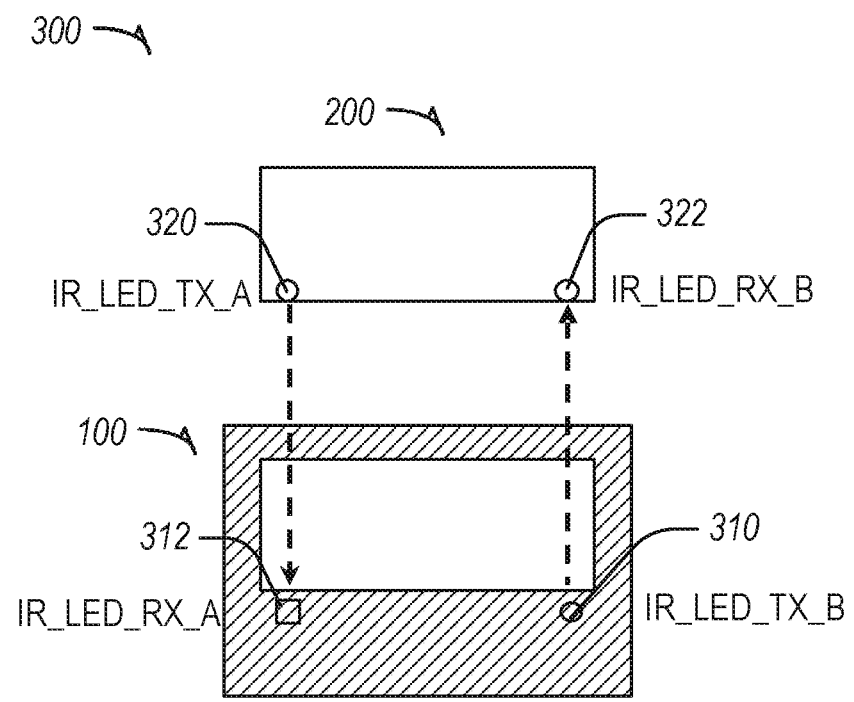
FIG. 17 is a schematic of communication system between a first and a second electronic device, in accordance with at least one example.

FIG. 17 shows a schematic of a communication system 300 that may be used to communicate between the first and second devices 100, 200 described herein, as well as other electronic devices. The communication system 300 may be used to perform aspects of FIGS. 18-21.

In at least one example, the communication system 300 may include the first device 100 having a first light transmitter 310 (e.g., emitter) and a first light receiver 312 (e.g., detector). The second device 200 may include a second light transmitter 320 (e.g., emitter) and a second light receiver 322 (e.g., detector).

Figure 18:
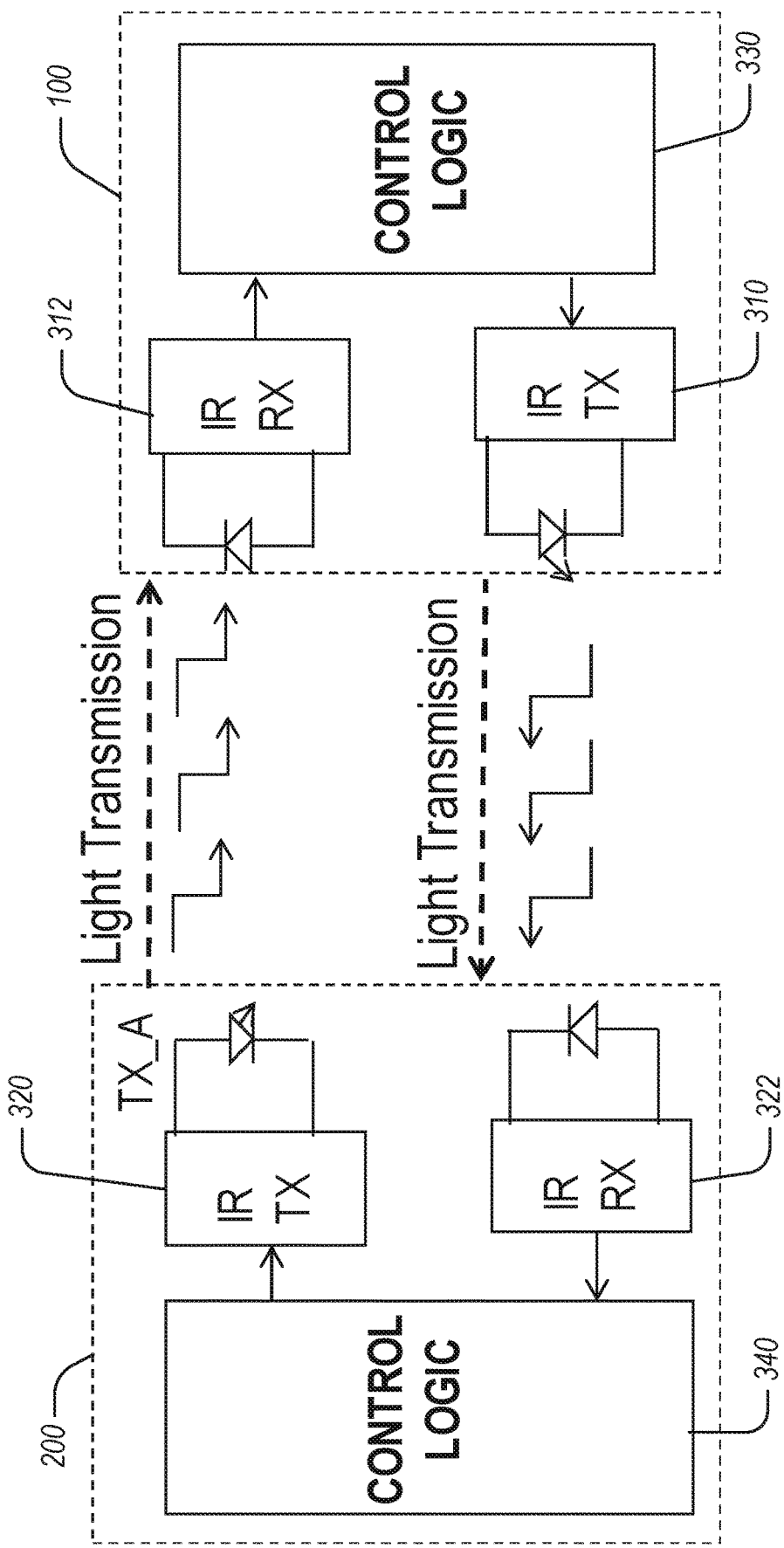
FIG. 18 is a schematic of a system to determine alignment between the first electronic device and the second electronic device using the communication system of FIG. 17, in accordance with at least one example.

FIG. 18 shows a schematic of an example alignment system to determine alignment between the first device 100 and the second device 200 using the communication system of FIG. 17. In the example, a first control logic 330 may be in electrical communication with the first light transmitter 310 and the first light receiver 312. A second control logic 340 may be in electrical communication with the second light transmitter 320 and the second light receiver 322.

The communication system 300 may be arranged to determine if the second device 200 is properly aligned with the first device 100. In some examples, in addition to detecting mis-alignment of the second device 200 relative to the first device 100, the communication system 300 may also provide an alignment or mis-alignment indication to the user, such as by a light-emitting diode (LED) indicator.

When the second device 200 is properly placed and aligned with an engagement surface 130 (FIG. 1) of the first device 100, the first light transmitter 310 may be received by the second light receiver 322, and the second light transmitter 320 may be received by the first light receiver 312. If the communication system 300 determines that the second device 200 is properly aligned with the first device 100, an indication may be provided to the user or an actuator (180, FIG. 7) may be caused to operably couple the first device 100 and the second device 200 together.

The communication system 300 may be based on infrared light having infrared light emitting diodes (IR LED) (e.g., first and second light transmitters, 310, 320) and infrared detecting sensors (e.g., first and second light receivers 312, 322). Other forms of light may be used, including but not limited to, lasers or light outside of the infrared range.

In some examples, only a single transmitter and/or receiver may be provided while still accomplishing some aspects. However, advantages of having a communication system 300 including two transmitters and two receivers (e.g., transceivers) is that proper alignment may be detected and two-way communication is provided. In a one-way communication system, the system may be fooled by light that is not being emitted by the single light emitter, but rather comes from another source.

Figure 19:
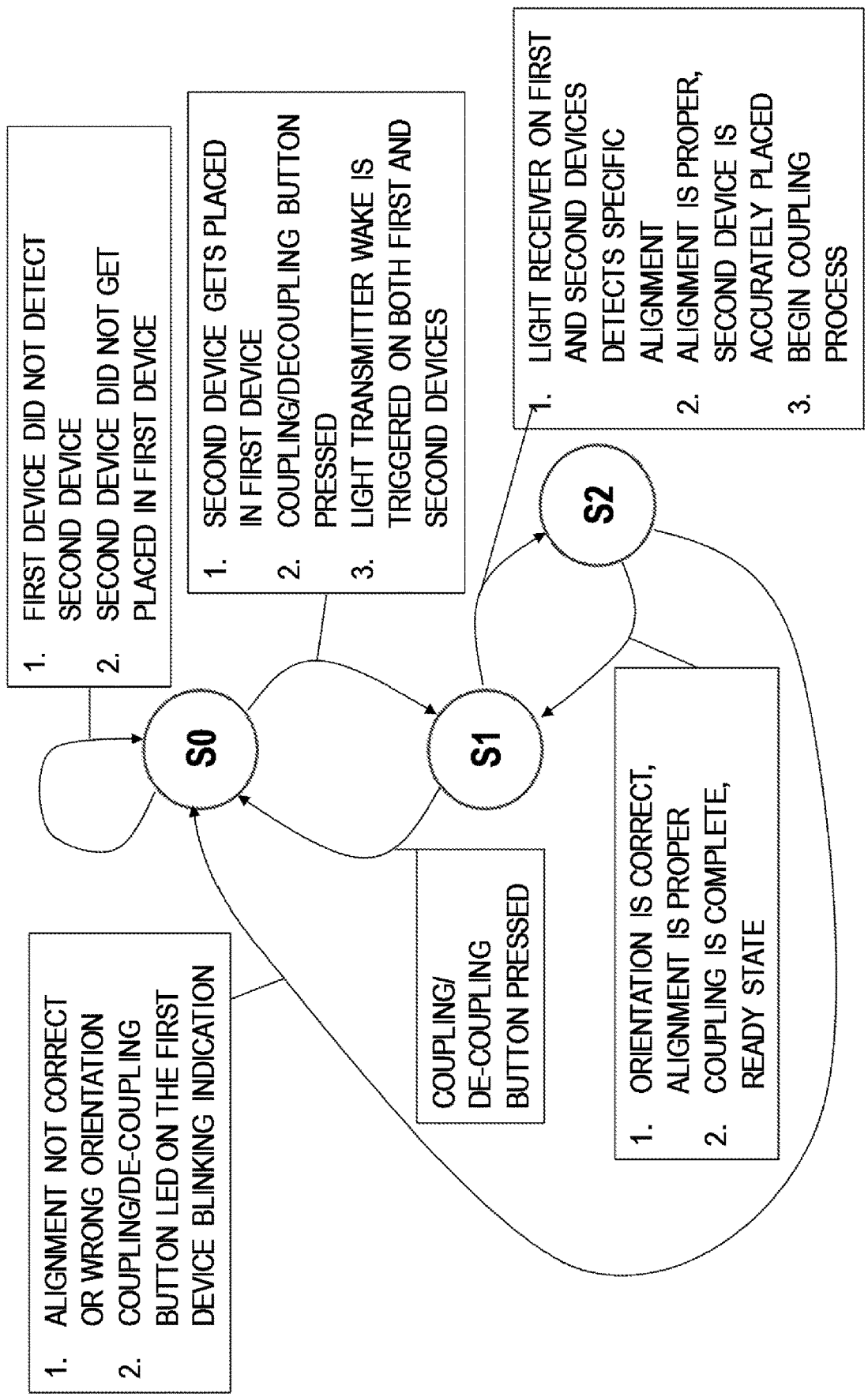
FIG. 19 is a state diagram for the system of FIG. 18, in accordance with at least one example.

FIG. 19 shows a state diagram for the alignment system of FIGS. 17 and 18. The state diagram explains how a wrong orientation of the second device 200 in the first device 100 may cause the system to indicate alignment failure to the user to re-orient the second device 200 and replace it on the first device 100, or to indicate proper alignment has been achieved.

In State S0, the first device 100 does not detect a second device 200, therefore a second device 200 may not be placed in the first device 100.

In State S1, the second device 200 may be detected as placed in the first device 100, and optionally, a coupling button may be pressed. The first and second light transmitters 310, 320 may be triggered on the first and second devices 100, 200.

In State S2, the first and second light receivers 312, 322 detect a specific alignment. If the alignment is proper, the second device 200 is properly placed on the first device 100, and the coupling process may be initiated. The first and second devices 100, 200 may remain in State S2 in the coupled and ready state until an indication is received to de-couple (e.g., user input or sensor). After de-coupling, the first device 100 may return to State S0 if the alignment or orientation is not correct. In State S0, an indicator light on the first device 100 may blink or otherwise indicate that the first and second devices 100, 200 may no longer be coupled or may be improperly coupled.

Some benefits of the alignment system of FIGS. 17-19 are that it may enhance the user experience. Upon the user placing the second device 200 into the first device 100, alignment detection may be completed based on communication from both the first and second electronic devices 100, 200. Once the communication is successful, it may be visually indicated to the user, or may cause a coupling system, such as the magnetic coupling systems described herein, to initiate coupling (e.g., docking).

Not only may the communication system 300 detect alignment, in some examples, the communication system 300 of FIG. 17 may also be adapted to serve as an identification system to determine an identity of the first device 100 and/or the second electronic device 200. In addition, the identification system may allow the first device 100 to automatically couple to the second device 200 once secure communication between the first and second devices 100, 200 is established.

The communication system 300 may be used to securely communicate via the first and second light transmitters 310, 320 and first and second light receivers 312, 322. Encrypted communication with a specific wavelength over the first and second transmitters 310, 320 and first and second receivers 312, 322 may be used to establish the secure communication. Encrypted communication may enhance the user's experience because the encrypted communication may avoid false coupling of the second device 200 to the first device 100 and accidental turning on or of the first device 100 without having the second device 200.

Figure 20:
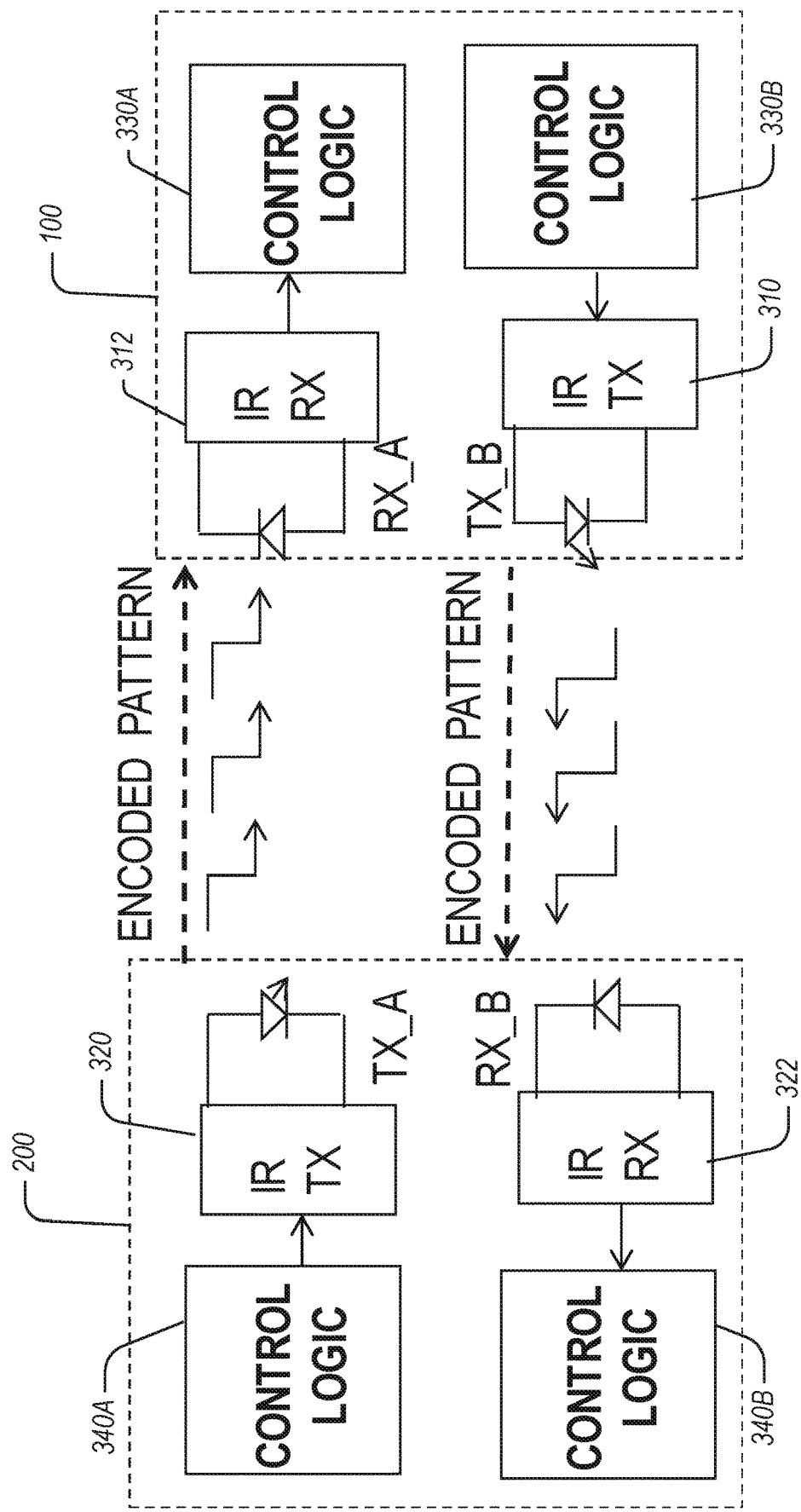
FIG. 20 is a schematic of a system to securely identify and allow coupling of the second electronic system to the first electronic system using the communication system of FIG. 17, in accordance with at least one example.

FIG. 20 shows a schematic of a system to securely identify, and, in some examples, allow coupling of the second device 200 to the first device 100 using the communication system 300 of FIG. 17. FIG. 20 is similar to FIG. 18; however, FIG. 20 shows an example where each of the first and second light transmitters 310, 320 and first and second receivers 312, 322 has their own control logic 330A, 330B, 340A, 340B.

In an example, the light communication system 300 may include the second light transmitter 320 being adapted to transmit a first encoded pattern to the first device 100. The first device 100 may be adapted to compare the first encoded pattern to a first specified pattern to validate the identity of the second device 200. If the first encoded pattern and the first specified pattern match, the first light transmitter 310 is adapted to transmit a second encoded pattern to the second device 200 and the second device 200 is adapted to compare the second encoded pattern to a second specified pattern to determine if the first and second devices 100, 200 match and are pairable. In some examples, the first specified pattern and the second specified pattern may be the same pattern.

If the communication system 300 determines that the first and second devices 100, 200 are pairable. The first device 100 may be adapted to initiate pairing. If the devices are pairable, coupling of the first and second devices 100, 200 may be automatically initiated without a user input, or an indication can be provided to the user that the devices are pairable.

In an example, the process of determining whether to pair the first and second devices 100, 200 may be based on successful decryption using, for example, linear feedback shift register (LFSR). Other encryption/decryption methods besides LFSR may be used. Custom control logic may initiate a 32-bit pattern generation LFSR. The second transmitter 320 on the second device may transmit this pattern, for example, at 980 nm wavelength to be received by the first receiver 312 on the first device 100. The number of bits and wavelength are not limited, this is merely an example. In other examples, other bit patterns, including a pattern configurable up to a 256-bit pattern may be provided.

Figure 21:
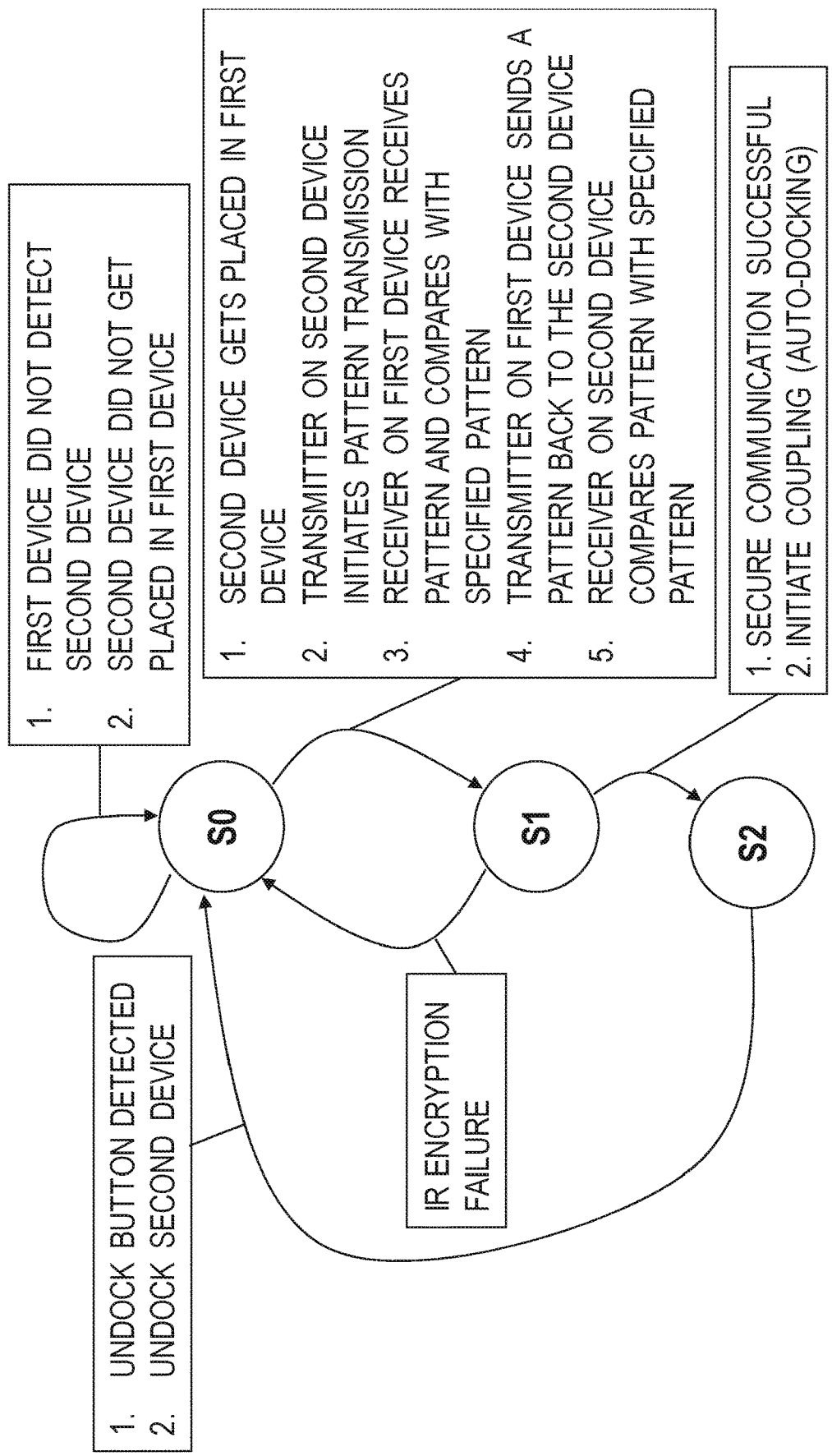
FIG. 21 is a state diagram for the system to securely identify and allow coupling of FIG. 20, in accordance with at least one example.

FIG. 21 shows a state diagram for the system to securely identify and allow coupling of FIG. 20, in accordance with at least one example. In State S0, the first device 100 does not detect the second device 200. In State S0, the second device 200 may not have been placed in the first device 100.

In State S1, the second device 200 may be placed in the first device 100. The second transmitter 320 on the second device 200 transmits a light pattern. The first receiver 312 on the first device 100 receives the light pattern and the first device 100 compares it with the first specified pattern, in return, the first device 100 uses the first transmitter 310 to send a second pattern back to the second device 200. The second receiver 322 on the second device compares the second pattern to the second specified pattern.

If the encryption failed, the first and second devices 100, 200 return to State S0. If encryption was successful, in State S2, the first and second devices 100, 200 may be securely communicating. Automatic coupling (e.g., docking) may also be initiated by the first device 100. If an instruction is received to de-couple (e.g., undock) the first and second devices 100, 200, the devices return to State S0.

In some examples, instead of the second device 200 initiating the first communication, the first device 100 may initiate the process.

Figure 22:
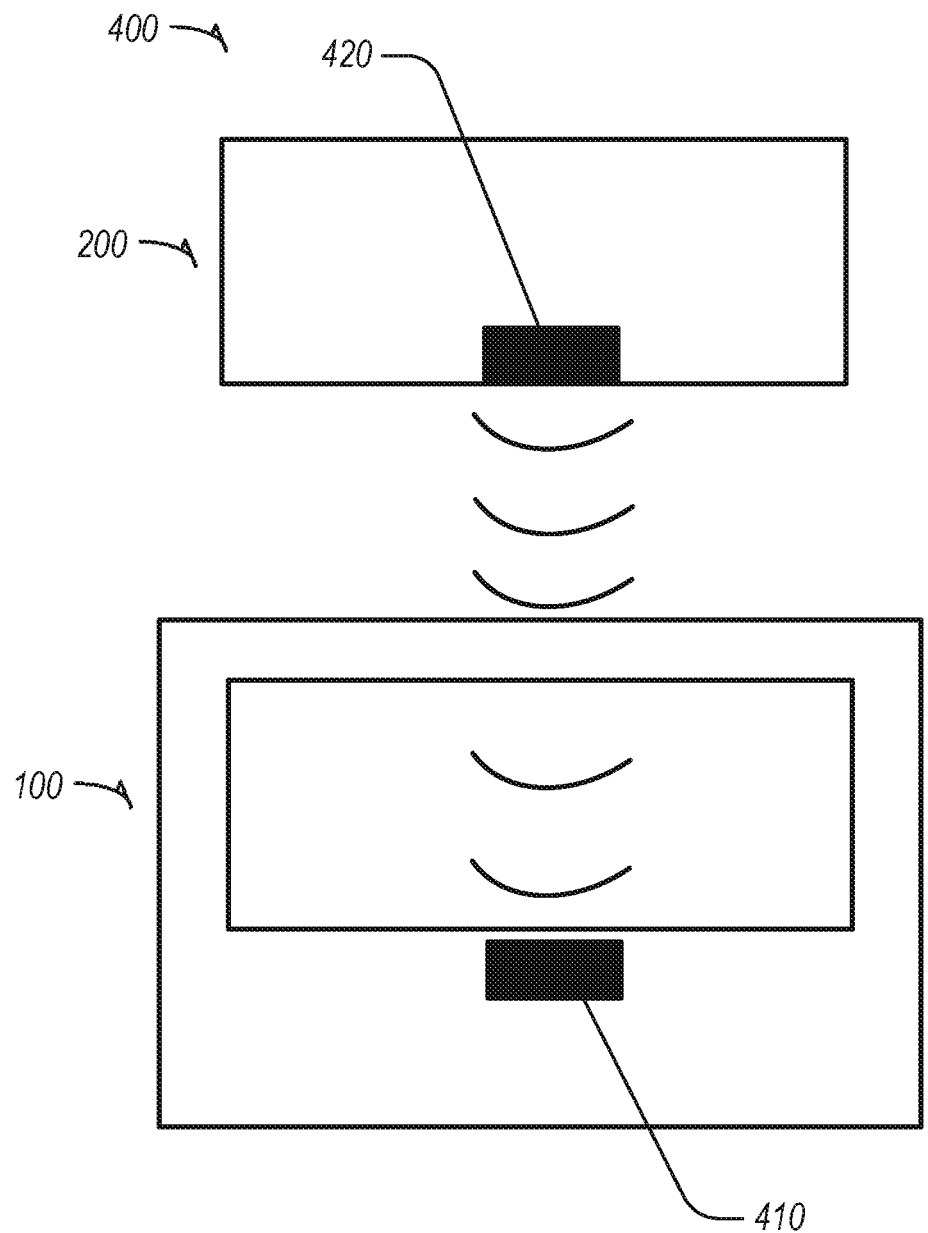
FIG. 22 is a schematic of a second communication system between a first and a second electronic device, in accordance with at least one example.

FIG. 22 shows a schematic of a second communication system 400 between a first and a second device 100, 200, in accordance with at least one example. The second communication system 400 may be a radio frequency identification (RFID) pairing system, although other communication systems such as near field communication (NFC) may also be provided. The radio-frequency identification (RFD) pairing system may include a first RFID communicator 410 (e.g., RFID beacon) coupled to the first device 100 and a second RFID communicator (e.g., RFID beacon) 420 coupled to the second device 200.

In some examples, only the first communication system 300, only the second communication system 400, both the first and second communication systems 300, 400, or neither the first or second communication systems 300, 400 are provided.

Figure 23:
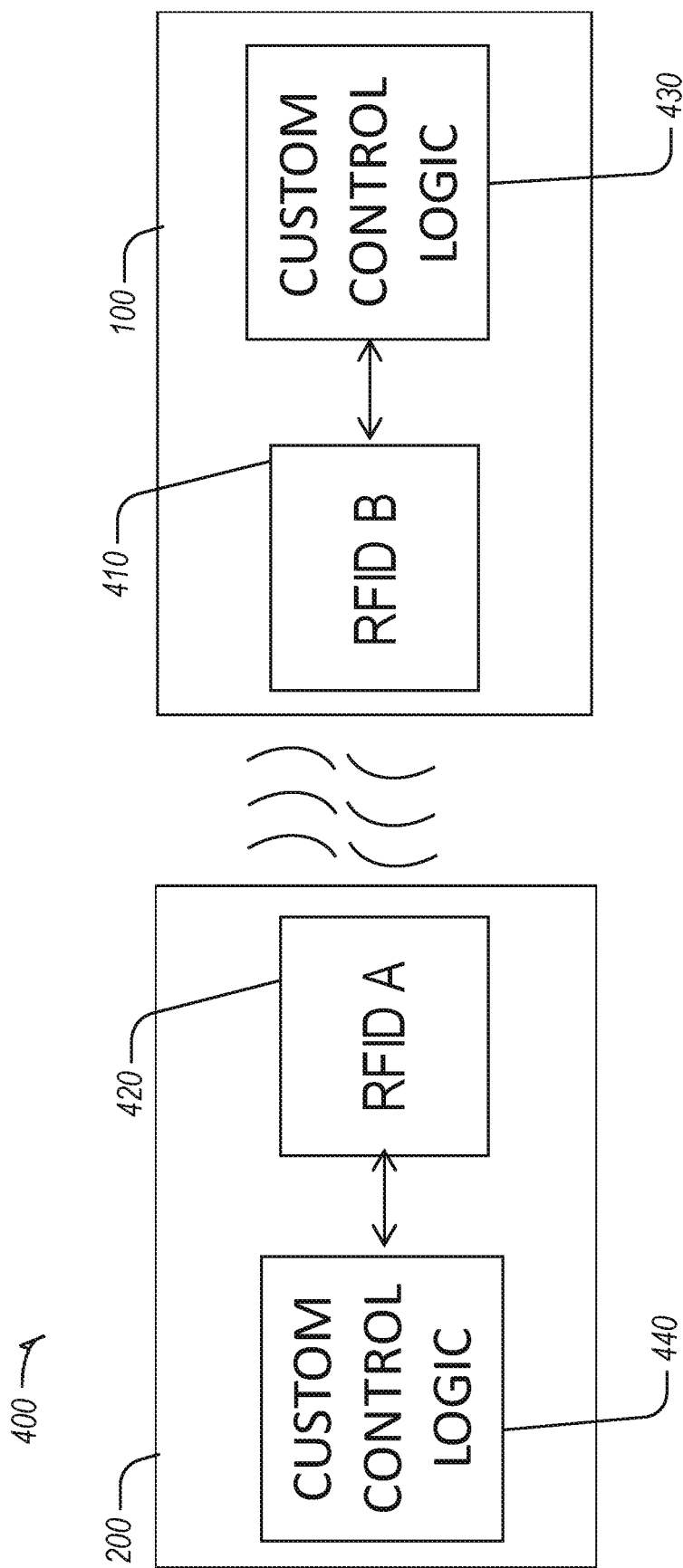
FIG. 23 is a schematic of a pairing system for low powered secured pairing between the first and second electronic devices, using the second communication system of FIG. 22, in accordance with at least one example.

FIG. 23 shows a schematic of a pairing system for low powered secured pairing between the first and second devices 100, 200, using the second communication system 400 of FIG. 22. A first RFID communicator 410 may be coupled to the first device 100 having first control logic 430 and a second RFID communicator 420 may be coupled to the second device 200 having second control logic 440. The first and second RFID communicators 410, 420 may communicate unique identifiers (IDs) to each other to securely identify each other.

For example, the first device 100 and second device 200 may be configured to default to operate in a first power mode. When the second RFID communicator 420 receives a first specified identification from the first RFID communicator 410, and the first RFID communicator 410 receives a second specified identification from the second RFID communicator 420, operation may be switched from the first power mode (e.g., a lower power mode) to a second power mode (e.g., a higher power mode than the low power mode). Although the example described provides two-way communication, a second communication system 400 having one-way communication may be provided. Either of the first or second device 100, 200 may initiate RFID communication.

In some examples, the second communication system 400 may be used to save power. Until successful RFID communication is established, a coupling/docking sequence may be prevented. The second communication system 400 may provide secure communication protocol over RFID, may provide an enhanced security level for detecting warranty tampering (e.g., change in hardware configuration).

Figure 24:
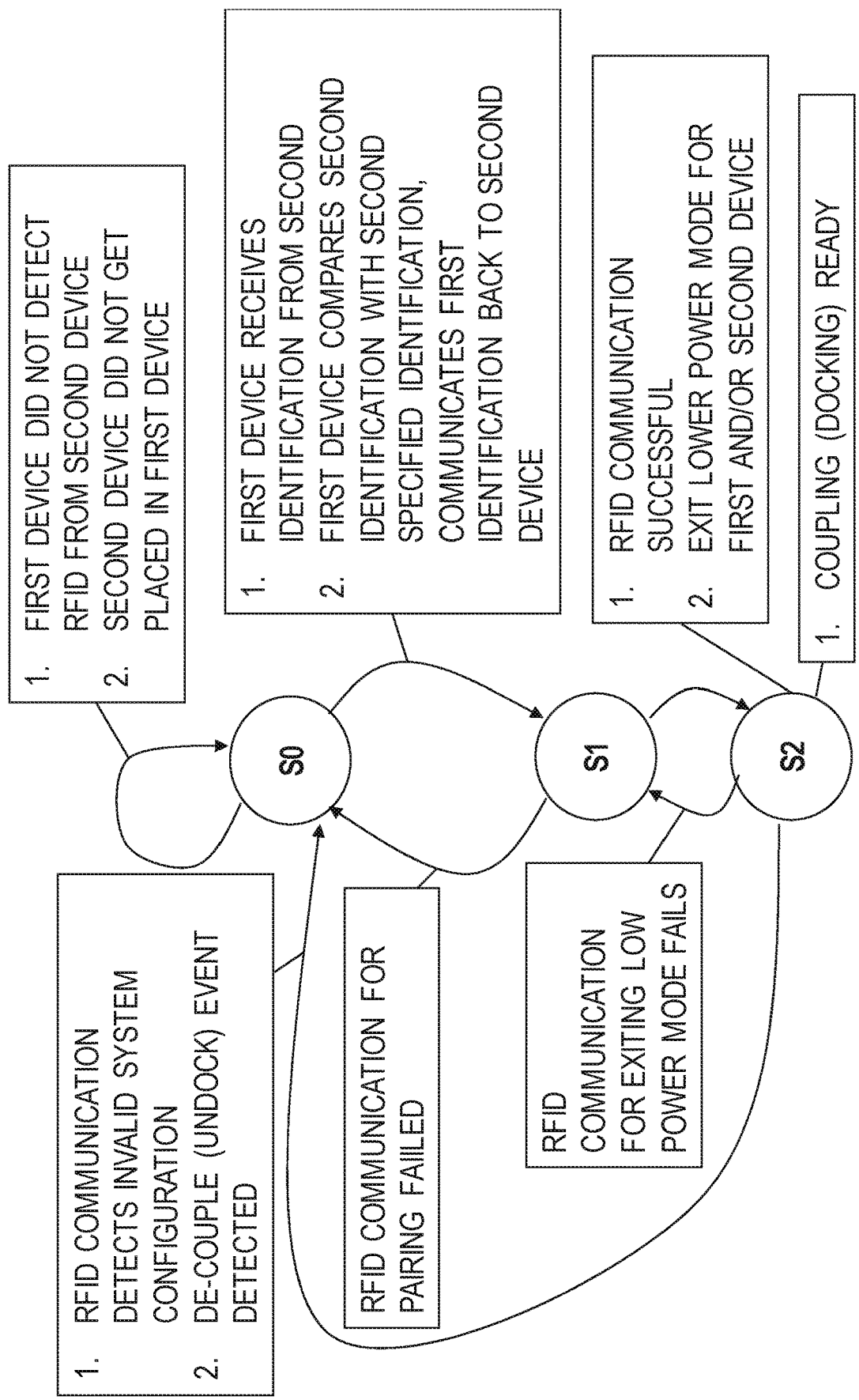
FIG. 24 is a state diagram for the second communication system of FIG. 22.

FIG. 24 shows a state diagram for the second communication system 400 of FIGS. 22 and 23. In State S0, the first device 100 does not detect RFID communication from the second device 200, in this case, the second device 200 may not be placed in the first device 100.

In State S1, the first device 100 receives a first identification from the second device 200. The first device 100 compares the first identification from the second device 200 and compares it with a first specified identification (e.g., first stored identification). If the first identification and the first specified identification match, the first device 100 transmits a second identification to the second device 200. The second device 200 compares the second identification to a second specified identification (e.g., second stored identification). If the second identification and the second specified identification match, two-way RFID communication is successful.

In State S2, the first and second devices 100, 200 may be ready for coupling. At this point, coupling may be initiated, or an indication may be provided to the user. State S2 may be maintained until the second communication system 400 detects an invalid second device 200 or a de-coupling event (e.g., undock event).

If one of the first identifications does not match the first specified identification, or the second identification doesn't match the second specified identification, RFID communication for pairing fails and the system returns to State S0.

Benefits of the second communication system 400 include the ability to initiate docking and powering on of the first and second devices 100, 200 and to enhance secure pairing. The first and second control logic 430, 440 (e.g. control modules) in the first and second devices 100, 200 may be programmable and customizable so that the first and second devices 100, 200 must match each other.

The above detailed description includes references to the accompanying drawings, which form a part of the detailed description. Such examples may include elements in addition to those shown or described. However, examples in which only those elements shown or described are provided are also contemplated. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other examples may be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed example. Thus, the following claims are hereby incorporated into the Detailed Description as examples or examples, with each claim standing on its own as a separate example, and it is contemplated that such examples may be combined with each other in various combinations or permutations. The scope of the invention should be determined with reference to the appended claims, along with the full scope of equivalents to which such claims are entitled.

VARIOUS NOTES AND EXAMPLES

To better illustrate the method and apparatuses disclosed herein, a non-limiting list of embodiments is provided here.

Example 1 is a first electronic device for operably receiving and coupling a second electronic device to the first electronic device, the first electronic device comprising: a housing including a first engagement surface adapted to operably receive the second electronic device; a first magnet array that is movably coupled to the housing; and a motion transfer mechanism coupled to the housing and the first magnet array to move the first magnet array relative to the housing to perform at least one of operably coupling or de-coupling the received second electronic device to or from the first electronic device.

In Example 2, the subject matter of Example 1 includes, wherein the motion transfer mechanism is adapted to move the first magnet array relative to the housing to attract or repel a second magnet array on the second electronic device.

In Example 3, the subject matter of Examples 1-2 includes, wherein the motion transfer mechanism includes a rack and pinion system.

In Example 4, the subject matter of Examples 1-3 includes, wherein the motion transfer mechanism includes a motor.

In Example 5, the subject matter of Example 4 includes, wherein the motion transfer mechanism converts a rotational output from the motor into a linear output to translate the first magnet array relative to the housing.

In Example 6, the subject matter of Examples 1-5 includes, wherein the first magnet array includes a top magnet array and a bottom magnet array, and wherein the motion transfer mechanism is adapted to transfer motion from an actuator to move the top magnet array and the bottom magnet array.

In Example 7, the subject matter of Example 6 includes, wherein the motion transfer mechanism further comprises: a connecting shaft extending from a first end portion to a second end portion; a first link to transfer motion to the bottom magnet array; and a second link to transfer motion to the top magnet array, wherein the first end portion is coupled to the first link to form a first coupling mechanism, and wherein the second end portion is coupled to the second link to form a second coupling mechanism.

In Example 8, the subject matter of Example 7 includes, wherein the first coupling mechanism includes a first rack and pinion system, and wherein the second coupling mechanism includes a second rack and pinion system.

In Example 9, the subject matter of Examples 1-8 includes, wherein the motion transfer mechanism includes an input element to activate an actuator.

In Example 10, the subject matter of Example 9 includes, wherein the input element includes a user-operable switch.

In Example 11, the subject matter of Examples 1-10 includes, electrical circuitry disposed in the housing, and wherein the first engagement surface comprises an aperture perimeter surrounding an aperture that extends through the housing.

In Example 12, the subject matter of Example 11 includes, wherein the first magnet array is coupled to the housing proximate the aperture perimeter.

In Example 13, the subject matter of Examples 11-12 includes, wherein the aperture perimeter of the first engagement surface is smaller than an outer perimeter of the second electronic device to be received.

In Example 14, the subject matter of Examples 1-13 includes, wherein the first electronic device is a foldable electronic device.

In Example 15, the subject matter of Examples 1-14 includes, wherein the first electronic device is a user interface module.

In Example 16, the subject matter of Examples 1-15 includes, wherein the first electronic device includes a display module hingeably coupled to a user input module.

In Example 17, the subject matter of Examples 1-16 includes, wherein the second electronic device to be received is a compute module.

Example 18 is a method for operably coupling or operably de-coupling a first electronic device and a second electronic device, the method comprising: receiving an indication to couple or de-couple the second electronic device to or from a first engagement surface of the first electronic device; and sending an instruction to a motion transfer mechanism, in response to the indication, to move a first magnet array of the first electronic device relative to a housing of the first electronic device to perform at least one of operably coupling or operably decoupling the first electronic device and the second electronic device.

In Example 19, the subject matter of Example 18 includes, wherein sending an instruction to move the first magnet array includes moving the first magnet array relative to the housing to attract or repel a second magnet array on the second electronic device.

In Example 20, the subject matter of Examples 18-19 includes, wherein sending an instruction to move the first magnet array includes sending an instruction to actuate a motor of the motion transfer mechanism.

In Example 21, the subject matter of Example 20 includes, wherein upon sending an instruction to move the first magnet array, moving the first magnetic array includes converting a rotational output from the motor into a linear output to translate the first magnet array relative to the housing.

In Example 22, the subject matter of Example 21 includes, wherein converting the rotational output into the linear output includes converting the rotational output through a rack and pinion system.

In Example 23, the subject matter of Examples 18-22 includes, wherein moving the first magnet array includes moving a top magnet array and a bottom magnet array.

In Example 24, the subject matter of Example 23 includes, wherein sending an instruction to the motion transfer mechanism includes sending an instruction to actuate a motor, and rotating, with the motor, a connecting shaft extending from a first end portion to a second end portion; translating a first link coupled to the first end portion to move the bottom magnet array; and translating a second link coupled to the second end portion to move the top magnet array.

In Example 25, the subject matter of Example 24 includes, wherein the moving the top magnet array includes moving a first rack and pinion system, and wherein moving the bottom magnet array includes moving a second rack and pinion system.

In Example 26, the subject matter of Examples 18-25 includes, wherein receiving the indication to couple or de-couple the second electronic device from the first electronic device includes receiving the indication from an input element.

In Example 27, the subject matter of Example 26 includes, wherein receiving the indication from an input element includes receiving the indication from a user operable switch on the first electronic device.

In Example 28, the subject matter of Examples 18-27 includes, wherein operably coupling the second electronic device to the first electronic device includes receiving the second electronic device at the first engagement surface of the first electronic device, wherein the first engagement surface comprises an aperture perimeter surrounding an aperture that extends through the housing.

In Example 29, the subject matter of Example 28 includes, wherein moving the first magnet array includes translating the first magnet array along a portion of the aperture perimeter.

In Example 30, the subject matter of Examples 28-29 includes, wherein operably coupling the second electronic device to the first electronic device includes receiving the second electronic device having an outer perimeter that is larger than the aperture perimeter.

In Example 31, the subject matter of Examples 18-30 includes, wherein the first electronic device is a foldable electronic device.

In Example 32, the subject matter of Examples 18-31 includes, wherein the first electronic device is a user interface module.

In Example 33, the subject matter of Examples 18-32 includes, wherein the first electronic device includes a display module hingeably coupled to a user input module.

In Example 34, the subject matter of Examples 18-33 includes, wherein the second electronic device to be received is a compute module.

Example 35 is at least one computer-readable medium comprising instructions to perform any of the methods of Examples 18-34.

Example 36 is a first electronic device or a second electronic device comprising means for performing any of the methods of Examples 18-34.

Example 37 is at least one machine-readable medium including instructions for operation of a first electronic device, and the instructions, when executed by a processor, cause the processor to perform operations to: receive an input instruction, from an input element, the instruction including an indication to couple or de-couple a second electronic device to or from the first electronic device; and in response to the received input instruction, send an instruction to an actuator, to move a first magnet array of the first electronic device relative to a housing of the first electronic device to attract or repel a second electronic device to couple or de-couple the first and second electronic devices.

In Example 38, the subject matter of Example 37 includes, wherein to send the instruction to move the first magnet array includes to send an instruction to move the first magnet array relative to the housing to attract or repel a second magnet array on the second electronic device.

In Example 39, the subject matter of Examples 37-38 includes, wherein to send an instruction to move the actuator includes to send an instruction to actuate a motor of a motion transfer mechanism.

In Example 40, the subject matter of Examples 37-39 includes, wherein to receive the indication from an input element includes to receive the indication from a user operable switch on the first electronic device.

In Example 41, the subject matter of Examples 37-40 includes, wherein the first electronic device is a foldable electronic device.

In Example 42, the subject matter of Examples 37-41 includes, wherein the first electronic device is a user interface module.

In Example 43, the subject matter of Examples 37-42 includes, wherein the first electronic device includes a display module hingeably coupled to a user input module.

In Example 44, the subject matter of Examples 37-43 includes, wherein the second electronic device to be received is a compute module.

Example 45 is a first electronic device for operably coupling or operably de-coupling the first electronic device and a second electronic device, the first electronic device comprising: a means for receiving an indication to couple or de-couple the second electronic device to or from a first engagement surface of the first electronic device; a means for sending an instruction, in response to the indication, to a means for transferring motion, wherein the means for transferring motion includes, a means for moving a first magnet array of the first electronic device relative to a housing of the first electronic device to perform at least one of operably coupling or operably decoupling the first electronic device and the second electronic device.

In Example 46, the subject matter of Example 45 includes, wherein the means for moving the first magnet array relative to the housing is adapted to move the first magnet array to attract or repel a second magnet array on the second electronic device.

In Example 47, the subject matter of Examples 45-46 includes, wherein the means for transferring motion includes a means for converting a rotational output from a means for rotating into a linear output from a means for translating the first magnet array relative to the housing.

In Example 48, the subject matter of Examples 45-47 includes, wherein the means for moving the first magnet array includes a means for moving a top magnet array and a means for moving a bottom magnet array.

In Example 49, the subject matter of Examples 45-48 includes, a means for receiving the second electronic device.

In Example 50, the subject matter of Examples 45-49 includes, wherein the first electronic device is a foldable electronic device.

In Example 51, the subject matter of Examples 45-50 includes, wherein the first electronic device is a user interface module.

In Example 52, the subject matter of Examples 45-51 includes, wherein the first electronic device includes a means for display and a means for user input.

In Example 53, the subject matter of Examples 45-52 includes, wherein the second electronic device to be received is a compute module.

Example 54 is a system for coupling a first electronic device to a second electronic device, the system comprising: a first electronic device including a first engagement surface and a first magnet array; a second electronic device including a second engagement surface and a second magnet array; and an actuator coupled to the first magnet array to move the first magnet array relative to the second magnet array to attractively couple or repulsively de-couple the second electronic device from the first electronic device.

In Example 55, the subject matter of Example 54 includes, wherein when the first electronic device is one of a user interface module or a compute module, and wherein the second electronic device is the other of a user interface module or a compute module.

In Example 56, the subject matter of Examples 54-55 includes, wherein the actuator is a motor, and when the motor is actuated, the first magnet array is translated.

In Example 57, the subject matter of Example 56 includes, wherein when the first magnet array is translated, like poles of the first magnet array and the second magnet array are aligned to magnetically repel the second electronic device away from the first electronic device.

In Example 58, the subject matter of Examples 56-57 includes, wherein when the first magnet array is translated, like poles of the first magnet array and the second magnet array are aligned to magnetically attract the second electronic device towards the first electronic device to operably couple the second electronic device to the first electronic device.

In Example 59, the subject matter of Example 58 includes, wherein the magnetic attraction between the first and second magnetic arrays cause a first electrical connection on the first electronic device to electrically connect to a second electrical connection on the second electronic device.

In Example 60, the subject matter of Examples 54-59 includes, a light communication system, wherein the light communication system includes a first light transmitter and a first light receiver included in the first electronic device, and a second light transmitter and a second light receiver included in the second electronic device, and wherein when the first light transmitter is received by the second light receiver, and the second light transmitter is received by the first light receiver, wherein the light communication system is arranged to determine if the second electronic device is properly aligned with the first electronic device.

In Example 61, the subject matter of Example 60 includes, wherein if the light communication system determines that the second electronic device is properly aligned with the first device, the actuator is caused to couple the first electronic device to the second electronic device.

In Example 62, the subject matter of Examples 60-61 includes, a light communication system adapted to determine an identity of the first electronic device and the second electronic device, wherein the light communication system includes a first light transmitter and a first light receiver coupled to the first electronic device, and a second light transmitter and a second light receiver coupled to the second electronic device, wherein the light communication system includes the second light transmitter adapted to transmit a first encoded pattern to the first electronic device, and the first electronic device is adapted to compare the first encoded pattern to a first specified pattern, and wherein if the first encoded pattern and the first specified pattern match, the first light transmitter is adapted to transmit a second encoded pattern to the second electronic device and the second electronic device is adapted to compare the second encoded pattern to a second specified pattern to determine if the first and second electronic devices are pairable.

In Example 63, the subject matter of Example 62 includes, wherein if the light communication system determines that the first and second electronic devices are pairable, the first electronic device is adapted to initiate pairing.

In Example 64, the subject matter of Examples 60-63 includes, a radio-frequency identification (RFD) pairing system including a first RFID communicator coupled to the first electronic device and a second RFID communicator coupled to the second electronic device, wherein the first electronic device and second electronic device are configured to default to operate in a first power mode, and when the second RFID communicator receives a first specified identification from the first RFID communicator, and the first RFID communicator receives a second specified identification from the second RFID communicator, operation is switched from the first power mode to a second power mode.

In Example 65, the subject matter of Example 64 includes, wherein the first mode is a low power mode, and the second power mode is a higher power than the first power mode.

Example 66 is at least one machine-readable medium including instructions that, when executed by processing circuitry, cause the processing circuitry to perform operations to implement of any of Examples 1-65.

Example 67 is an apparatus comprising means to implement of any of Examples 1-65.

Example 68 is a system to implement of any of Examples 1-65.

Example 69 is a method to implement of any of Examples 1-65.

What is claimed is:

1. A first electronic device for operably receiving and coupling a second electronic device to the first electronic device, the first electronic device comprising:
    a housing including a first engagement surface adapted to operably receive the second electronic device;
    a display module hingeably coupled to the housing;
    a first magnet array that is movably coupled to the housing; and
    a motion transfer mechanism coupled to the housing and the first magnet array to move the first magnet array relative to the housing to perform at least one of operably coupling or de-coupling the received second electronic device to or from the first electronic device, wherein the second electronic device is a compute module.

2. The first electronic device of claim 1, wherein the motion transfer mechanism is adapted to move the first magnet array relative to the housing to attract or repel a second magnet array on the second electronic device.

3. The first electronic device of claim 1, wherein the motion transfer mechanism includes a rack and pinion system.

4. The first electronic device of claim 1, wherein the motion transfer mechanism includes a motor, and wherein the motion transfer mechanism converts a rotational output from the motor into a linear output to translate the first magnet array relative to the housing.

5. The first electronic device of claim 1, wherein the first magnet array includes a first located first magnet array and a second located first magnet array, and wherein the motion transfer mechanism is adapted to transfer motion from an actuator to move the first located first magnet array and the second located first magnet array.

6. The first electronic device of claim 5, wherein the motion transfer mechanism further comprises:
    a connecting shaft extending from a first end portion to a second end portion of the motion transfer mechanism;

a first link to transfer motion to the first located first magnet array; and a second link to transfer motion to the second located first magnet array, wherein the first end portion is coupled to the first link to form a first coupling mechanism, and wherein the second end portion is coupled to the second link to form a second coupling mechanism.

7. The first electronic device of claim 6, wherein the first coupling mechanism includes a first rack and pinion system, and wherein the second coupling mechanism includes a second rack and pinion system.

8. The first electronic device of claim 1, further comprising electrical circuitry disposed in the housing, wherein the first engagement surface comprises an aperture perimeter surrounding an aperture that extends through the housing from the first engagement surface to a second surface opposite the first engagement surface, and wherein the first engagement surface is configured to receive the second electronic device in the aperture.

9. The first electronic device of claim 1, wherein the first electronic device comprises a user interface module.

10. The first electronic device of claim 1, wherein the first electronic device includes a light communication system having a first light transmitter configured to transmit light to the second electronic device, and a first light receiver configured to receive light emitted by the second electronic device to determine if the second electronic device is properly aligned with the first electronic device.

11. The first electronic device of claim 10, wherein responsive to the light communication system determining that the second electronic device is properly aligned with the first electronic device, an actuator is caused to couple the first electronic device to the second electronic device.

12. An electronic device for operably receiving and coupling a compute module to the electronic device, the electronic device comprising:

a housing including a first engagement surface and a second surface opposite the first engagement surface, the first engagement surface adapted to operably receive the compute module;

a display module hingeably coupled to the housing; and a first magnet array that is movably coupled to the housing to perform at least one of operably coupling or de-coupling the received compute module to or from the electronic device.

13. The electronic device of claim 12, further comprising a motion transfer mechanism coupled to the housing and the first magnet array, wherein the motion transfer mechanism is configured to move the first magnet array relative to the housing to attract or repel a second magnet array of the compute module.

14. The electronic device of claim 13, further comprising a motor, wherein the motion transfer mechanism converts a rotational output from the motor into a linear output to translate the first magnet array relative to the housing.

15. The electronic device of claim 13, wherein the first magnet array includes a first located first magnet array and a second located first magnet array, and wherein the motion transfer mechanism is adapted to transfer motion from an actuator to move the first located first magnet array and the second located first magnet array.

16. The electronic device of claim 15, wherein the motion transfer mechanism further comprises:

a connecting shaft extending from a first end portion to a second end portion of the motion transfer mechanism;

a first link to transfer motion to the first located first magnet array; and a second link to transfer motion to the second located first magnet array, wherein the first end portion is coupled to the first link to form a first coupling mechanism, wherein the second end portion is coupled to the second link to form a second coupling mechanism, wherein the first coupling mechanism includes a first rack and pinion system, and wherein the second coupling mechanism includes a second rack and pinion system.

17. The electronic device of claim 12, wherein the first engagement surface comprises an aperture perimeter surrounding an aperture that extends through the housing from the first engagement surface to the second surface, wherein the first engagement surface is configured to receive the compute module in the aperture.

18. An electronic device for operably receiving and coupling a compute module to the electronic device, the electronic device comprising:

a housing including a first engagement surface adapted to operably receive the compute module;

a display module hingeably coupled to the housing;

a first magnet array that is movably coupled to the housing; and a motion transfer mechanism coupled to the housing and the first magnet array to move the first magnet array relative to the housing to perform at least one of operably coupling or de-coupling the received compute module to or from the electronic device, wherein the motion transfer mechanism includes a rack and pinion system.

19. The electronic device of claim 18, wherein the motion transfer mechanism includes a motor, wherein the motion transfer mechanism converts a rotational output from the motor into a linear output to translate the first magnet array relative to the housing.

20. The electronic device of claim 18, further comprising electrical circuitry disposed in the housing, wherein the first engagement surface comprises an aperture perimeter surrounding an aperture that extends through the housing from the first engagement surface to a second surface, and wherein the first engagement surface is configured to receive the compute module in the aperture.

* * * * *